United States Patent
Das et al.

(10) Patent No.: US 10,672,995 B2
(45) Date of Patent: Jun. 2, 2020

(54) ORGANOMETALLIC COMPOUND AND ORGANIC LIGHT-EMITTING DEVICE INCLUDING THE SAME

(71) Applicants: Samsung Electronics Co., Ltd., Suwon-si, Gyeonggi-do (KR); Samsung SDI Co., Ltd., Yongin-si, Gyeonggi-do (KR)

(72) Inventors: Rupasree Ragini Das, Suwon-si (KR); Kangmun Lee, Suwon-si (KR); Changho Noh, Suwon-si (KR); Hyejin Bae, Suwon-si (KR); Virendra Kumar Rai, Suwon-si (KR); Dmitry Kravchuk, Suwon-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 410 days.

(21) Appl. No.: 14/801,080

(22) Filed: Jul. 16, 2015

(65) Prior Publication Data
US 2016/0028026 A1 Jan. 28, 2016

(30) Foreign Application Priority Data
Jul. 24, 2014 (KR) .................. 10-2014-0094157
Apr. 6, 2015 (KR) .................. 10-2015-0048325

(51) Int. Cl.
*H01L 51/54* (2006.01)
*C09K 11/06* (2006.01)
*H01L 51/00* (2006.01)
*C07F 15/00* (2006.01)
*H01L 51/50* (2006.01)

(52) U.S. Cl.
CPC ...... *H01L 51/0085* (2013.01); *C07F 15/0033* (2013.01); *C09K 11/06* (2013.01); *C09K 2211/1007* (2013.01); *C09K 2211/1029* (2013.01); *C09K 2211/1044* (2013.01); *C09K 2211/1059* (2013.01); *C09K 2211/1074* (2013.01); *C09K 2211/185* (2013.01); *H01L 51/0059* (2013.01); *H01L 51/0067* (2013.01); *H01L 51/0072* (2013.01); *H01L 51/5016* (2013.01)

(58) Field of Classification Search
CPC .... C07F 15/00; C07F 15/0033; C07F 15/004; C09K 11/06; C09K 2211/00; C09K 2211/10; C09K 2211/1018; C09K 2211/1029; C09K 2211/1044; C09K 2211/1059; C09K 2211/1007; C09K 2211/1003; C09K 2211/185; H01L 51/0032; H01L 51/005; H01L 51/0051; H01L 51/0059; H01L 51/0067; H01L 51/0071; H01L 51/0072; H01L 51/0084; H01L 51/0085; H01L 51/50; H01L 51/5012; H01L 51/5016
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 2004/0230061 A1* | 11/2004 | Seo | C07F 15/0033 548/402 |
| 2006/0008670 A1* | 1/2006 | Lin | C07D 231/12 428/690 |
| 2006/0280966 A1* | 12/2006 | Otsu | C09K 11/06 428/690 |
| 2007/0190359 A1* | 8/2007 | Knowles | C07F 15/0033 428/690 |
| 2012/0223634 A1 | 9/2012 | Xia et al. | |
| 2013/0048963 A1 | 2/2013 | Beers et al. | |
| 2014/0027716 A1* | 1/2014 | Tsai | C07F 15/0033 257/40 |
| 2015/0249222 A1* | 9/2015 | Szigethy | C09K 11/06 257/40 |

* cited by examiner

*Primary Examiner* — Andrew K Bohaty
(74) *Attorney, Agent, or Firm* — Cantor Colburn LLP

(57) ABSTRACT

An organometallic compound represented by Formula 1:

$$Ir(L_1)_n(L_2)_{(3-n)} \quad \text{Formula 1}$$

wherein in Formula 1, $L_1$, $L_2$, and n are the same as described in the specification.

21 Claims, 8 Drawing Sheets

ORGANOMETALLIC COMPOUND AND ORGANIC LIGHT-EMITTING DEVICE INCLUDING THE SAME

CROSS-REFERENCE TO RELATED APPLICATIONS

This application claims priority to and the benefit of Korean Patent Application Nos. 10-2014-0094157, filed on Jul. 24, 2014, and 10-2015-0048325, filed on Apr. 6, 2015, in the Korean Intellectual Property Office, the disclosure of which is incorporated herein in its entirety by reference.

BACKGROUND

1. Field

The present disclosure relates to an organometallic compound and an organic light-emitting device including the same.

2. Description of the Related Art

Organic light emitting devices (OLEDs) are self-emission devices that have wide viewing angles, high contrast ratios, and short response times. In addition, OLEDs exhibit excellent brightness, driving voltage, and response speed characteristics, and produce full-color images.

A typical organic light-emitting device includes an anode, a cathode, and an organic layer that is disposed between the anode and the cathode and includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons are recombined in the emission layer to produce excitons. These excitons change from an excited state to a ground state, thereby generating light.

Various types of organic light emitting devices are known. However, there still remains a need in OLEDs having low driving voltage, high efficiency, high brightness, and long lifespan.

SUMMARY

Provided are organometallic compounds and organic light-emitting devices including the same.

According to an aspect, an organometallic compound is represented by Formula 1:

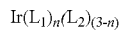

Formula 1

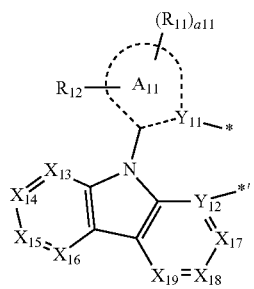

Formula 2

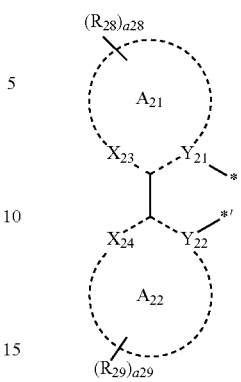

Formula 3 wherein in Formulae 1 to 3, $L_1$ is a first ligand represented by Formula 2;

$L_2$ is a second ligand represented by Formula 3;

n is selected from 1, 2, and 3;

$A_{11}$ is selected from a $C_6$-$C_{60}$ cyclic group and $C_1$-$C_{60}$ heterocyclic group, each includes $Y_{11}$ as a cyclic ring member;

$A_{21}$ is selected from a $C_6$-$C_{60}$ cyclic group and a $C_1$-$C_{60}$ heterocyclic group, each includes $X_{23}$ and $Y_{21}$ as cyclic ring members;

$A_{22}$ is selected from a $C_6$-$C_{60}$ cyclic group and a $C_1$-$C_{60}$ heterocyclic group, each includes $X_{24}$ and $Y_{22}$ as cyclic ring members;

$Y_{11}$, $Y_{12}$, $Y_{21}$, and $Y_{22}$ are each independently selected from C and N;

$X_{13}$ is N or $CR_{13}$; $X_{14}$ is N or $CR_{14}$; $X_{15}$ is N or $CR_{15}$; $X_{16}$ is N or; $X_{17}$ is N or $CR_{17}$;

$X_{18}$ is N or $CR_{18}$; and $X_{19}$ is N or $CR_{19}$;

$X_{23}$ is N or $CR_{23}$; and $X_{24}$ is N or $CR_{24}$;

$R_{11}$ to $R_{19}$, $R_{23}$, $R_{24}$, $R_{28}$, and $R_{29}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11, a28, and a29 are each independently selected from 1, 2, 3, 4, 5, and 6;

$R_{12}$ and $R_{13}$ are optionally linked to each other via a divalent linking group selected from a single bond, *—O—*', *—S—*', *—N($Z_{11}$)—*', and *—[C($Z_{11}$)($Z_{12}$)]$_{b11}$—*'; wherein $Z_{11}$ and $Z_{12}$ are each independently selected from a hydrogen, a deuterium, —F, —Cl, —Br, —I, a substituted or unsubstituted $C_1$-$C_{60}$ alkyl group, and a substituted or unsubstituted $C_6$-$C_{60}$ aryl group;

b11 is selected from 1, 2, 3, and 4;

* and *' are each independently a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$);

$Q_{11}$ to $Q_{13}$, $Q_{21}$ to $Q_{23}$, and $Q_{31}$ to $Q_{33}$ are each independently selected from a $C_1$-$C_{60}$ alkyl group and $C_6$-$C_{60}$ aryl group.

According to another aspect, an organic light-emitting device includes:

a first electrode;

a second electrode; and an organic layer disposed between the first electrode and the second electrode, wherein the organic layer includes an emission layer and at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
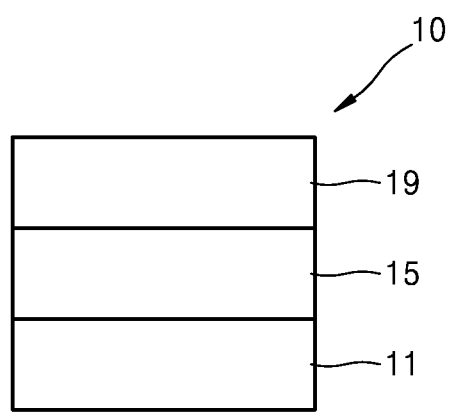
FIG. 1 is a schematic cross-sectional view of an organic light-emitting device (OLED) according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organometallic compound represented by Formula 1 below:

$$Ir(L_1)n(L_2)_{(3-n)} \quad \text{Formula 1}$$

The organometallic compound may include at least one cyano group as a substituent, but is not limited thereto.

$L_1$ in Formula 1 is a first ligand represented by Formula 2 below:

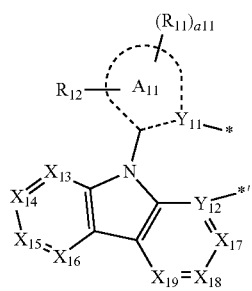

Formula 2

$L_2$ in Formula 1 is a first ligand represented by Formula 3 below:

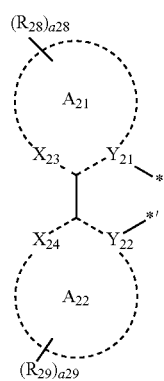

Formula 3

In some embodiments, at least one of $L_1$ and $L_2$ in Formula 1 may include at least one cyano group as a substituent, but is not limited thereto.

In some embodiments, $L_1$ in Formula 1 may include at least one cyano group as a substituent, but is not limited thereto.

In some embodiments, $L_2$ in Formula 1 may include at least one cyano group as a substituent, but is not limited thereto.

In some embodiments, at least one selected from $R_{11}$ to $R_{19}$, $R_{23}$, $R_{24}$, $R_{28}$, and $R_{29}$ in Formulae 2 and 3 may be a cyano group, but is not limited thereto.

In some embodiments, at least one selected from $R_{11}$, $R_{15}$, and $R_{29}$ in Formulae 2 and 3 may be a cyano group, but is not limited thereto.

In some embodiments, $R_{11}$ in Formula 2 may be a cyano group, but is not limited thereto.

In some embodiments, $R_{15}$ in Formula 2 may be a cyano group, but is not limited thereto.

In some embodiments, $R_{29}$ in Formula 3 may be a cyano group, but is not limited thereto.

n in Formula 1 indicates the number of groups $L_1$, and n may be selected from 1, 2, and 3. When n is an integer of 2 or more, groups $L_1$ may be identical or different.

In some embodiments, n in Formula 1 may be selected from 2 and 3, but is not limited thereto.

In Formulae 2 and 3, $A_{11}$ may be selected from a $C_6$-$C_{60}$ cyclic group and a $C_1$-$C_{60}$ heterocyclic group, each including $Y_{11}$ as a cyclic ring member; $A_{21}$ may be selected from a $C_6$-$C_{60}$ cyclic group and a $C_1$-$C_{60}$ heterocyclic group, each including $X_{23}$ and $Y_{21}$ as cyclic ring members; $A_{22}$ may be selected from a $C_6$-$C_{60}$ cyclic group and a $C_1$-$C_{60}$ heterocyclic group, each including $X_{24}$ and $Y_{22}$ as ring members.

In some embodiments, $A_{11}$, $A_{21}$, and $A_{22}$ in Formulae 2 and 3 may be each independently selected from a benzene, a naphthalene, an anthracene, a phenanthrene, a pyrrole, an imidazole, a pyrazole, a thiazole, an isothiazole, an oxazole, an isoxazole, a pyridine, a pyrazine, a pyrimidine, a pyridazine, a quinoline, an isoquinoline, a benzoquinoline, a quinoxaline, a quinazoline, a benzoimidazole, a benzoxazole, an isobenzoxazole, a triazole, a tetrazole, an oxadiazole, a triazine, a pyridoindole, a pyridofuran, and a pyridothiophene, but is not limited thereto.

In some embodiments, $A_{11}$ in Formula 2 may be selected from a benzene, a naphthalene, a pyrrole, an imidazole, and a pyrazole, but is not limited thereto.

In some embodiments, $A_{11}$ in Formula 2 may be selected from a benzene and an imidazole, but is not limited thereto.

In some embodiments, $A_{21}$ and $A_{22}$ in Formula 2 may be each independently selected from a benzene, a naphthalene, a pyrrole, an imidazole, a pyrazole, a pyridine, a pyrazine, a pyrimidine, a pyridazine, a quinoline, an isoquinoline, a quinoxaline, a quinazoline, a triazole, and a tetrazole, but is not limited thereto.

$Y_{11}$, $Y_{12}$, $Y_{21}$, and $Y_{22}$ in Formulae 2 and 3 may be each independently selected from a carbon atom (C) and nitrogen atom (N).

In some embodiments, in Formulae 2 and 3, $Y_{11}$ and $Y_{12}$ may be different, and $Y_{21}$ and $Y_{22}$ may be different, but is not limited thereto.

In some embodiments, in Formulae 2 and 3, $Y_{11}$ may be N, $Y_{12}$ may be C, $Y_{21}$ may be N, and $Y_{22}$ may be C, but is not limited thereto.

In some embodiments, in Formulae 2 and 3, $Y_{11}$ may be C, $Y_{12}$ may be N, $Y_{21}$ may be N, and $Y_{22}$ may be C, but is not limited thereto.

In Formula 2, $X_{13}$ may be N or $CR_{13}$; $X_{14}$ may be N or $CR_{14}$; $X_{15}$ may be N or $CR_{15}$; $X_{16}$ may be N or $CR_{16}$; $X_{17}$ may be N or $CR_{17}$; $X_{18}$ may be N or $CR_{18}$; and $X_{19}$ may be N or $CR_{19}$.

In some embodiments, at least one selected from $X_{13}$ to $X_{19}$ in Formula 2 may be N, but is not limited thereto.

In some embodiments, at least one selected from $X_{13}$ to $X_{16}$ in Formula 2 may be N, but is not limited thereto.

In some embodiments, at least one selected from $X_{13}$ to $X_{15}$ in Formula 2 may be N, but is not limited thereto.

In Formula 3, $X_{23}$ may be N or $CR_{23}$; and $X_{24}$ may be N or $CR_{24}$.

In some embodiments, $X_{23}$ in Formula 3 may be N, but is not limited thereto.

$R_{11}$ to $R_{19}$, $R_{23}$, $R_{24}$, $R_{28}$, and $R_{29}$ in Formulae 2 and 3 may be each independently selected from a hydrogen, a deuterium, —F (a fluoro group), —Cl (a chloro group), —Br (a bromo group), —I (an iodo group), a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$); wherein $Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, $R_{11}$ to $R_{19}$, $R_{23}$, $R_{24}$, $R_{28}$, and $R_{29}$ in Formulae 2 and 3 may be each independently selected from a hydrogen, a deuterium, —F, —Cl, —Br, —I, a cyano group, a $C_1$-$C_{60}$ alkyl group, a $C_1$-$C_{60}$ alkoxy group, a $C_6$-$C_{60}$ aryl group, and a $C_1$-$C_{60}$ heteroaryl group;

a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a deuterium, —F, —Cl, —Br, —I, a methyl group, an ethyl group, a n-propyl group, an iso-propyl group, a n-butyl group, an iso-butyl group, a sec-butyl group, a tert-butyl group, a methoxy group, an ethoxy group, a tert-butoxy group, a phenyl group, a naphthyl group, a pyridinyl group, a pyrimidinyl group, and —Si($Q_{31}$)($Q_{32}$)($Q_{33}$); and a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a phenyl group, a naphthyl group, a pyridinyl group, and a pyrimidinyl group, each substituted with at least one selected from a deuterium, —F, —Cl, —Br, —I, a methyl group, an ethyl group, a phenyl group, a naphthyl group, a pyridinyl group, and a pyrimidinyl group; wherein $Q_{31}$ to $Q_{33}$ may be each independently selected from a methyl group, an ethyl group, an iso-propyl group, a tert-butyl group, a phenyl group, and a naphthyl group, but is not limited thereto.

In some embodiments, $R_{11}$ to $R_{19}$, $R_{23}$, $R_{24}$, $R_{28}$, and $R_{29}$ in Formulae 2 and 3 may be each independently selected from a hydrogen, a deuterium, —F, —Cl, —Br, —I, a cyano group, a methyl group, an ethyl group, a n-propyl group, an iso-propyl group, a n-butyl group, an iso-butyl group, a sec-butyl group, a tert-butyl group, a phenyl group, a naphthyl group, a pyridinyl group, and a pyrimidinyl group;

a phenyl group and a naphthyl group, each substituted with at least one selected from a deuterium, —F, a methyl group, an ethyl group, an iso-propyl group, a tert-butyl group, and —Si($Q_{31}$)($Q_{32}$)($Q_{33}$); and a phenyl group and a naphthyl group, each substituted with at least one selected from a phenyl group and a naphthyl group, each substituted with at least one selected from a deuterium, —F, —Cl, —Br, —I, a methyl group, an ethyl group, a phenyl group, a naphthyl group, a pyridinyl group, and a pyrimidinyl group; wherein $Q_{31}$ to $Q_{33}$ may be each independently selected from a methyl group and a phenyl group, but is not limited thereto.

In some embodiments, $R_{11}$ to $R_{19}$, $R_{23}$, $R_{24}$, $R_{28}$, and $R_{29}$ in Formulae 2 and 3 may be each independently selected from a hydrogen, a deuterium, —F, —Cl, —Br, —I, a cyano group, and any group selected from Formulae 5-1 to 5-7 below, but is not limited thereto:

5-1

5-2

5-3

5-4

5-5

5-6

5-7 wherein in Formulae 5-1 to 5-7, $Z_1$ may be selected from a hydrogen, a deuterium, —F, a methyl group, an ethyl group, an iso-propyl group, a tert-butyl group, and —Si($CH_3$)$_3$; and a phenyl group and a naphthyl group, each substituted with at least one selected from a deuterium, —F, —Cl, —Br, —I, a methyl group, an ethyl group, a phenyl group, a naphthyl group, a pyridinyl group, and a pyrimidinyl group;

d1 may be selected from 1, 2, 3, 4, and 5;

d2 may be selected from 1, 2, 3, 4, 5, 6, and 7; and

* indicates a binding site to a neighboring atom.

In some embodiments, $R_{11}$ to $R_{19}$, $R_{23}$, $R_{24}$, $R_{28}$, and $R_{29}$ in Formulae 2 and 3 may be each independently selected from a hydrogen, a deuterium, —F, —Cl, —Br, —I, a cyano group, and any group selected from Formulae 6-1 to 6-13 below, but is not limited thereto:

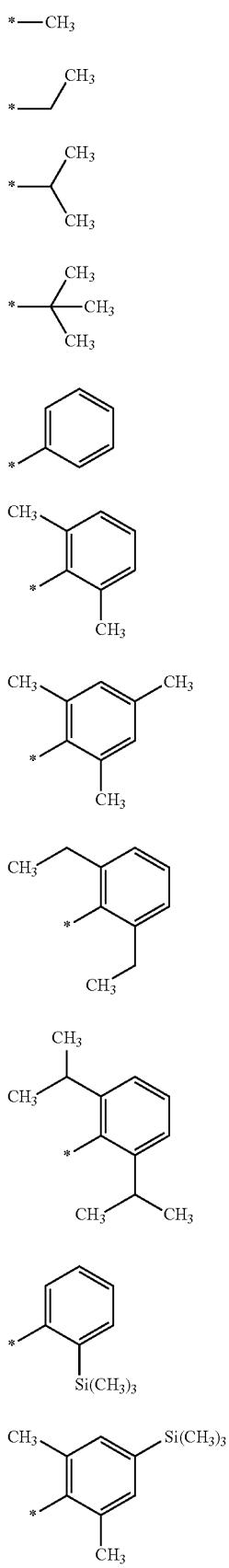

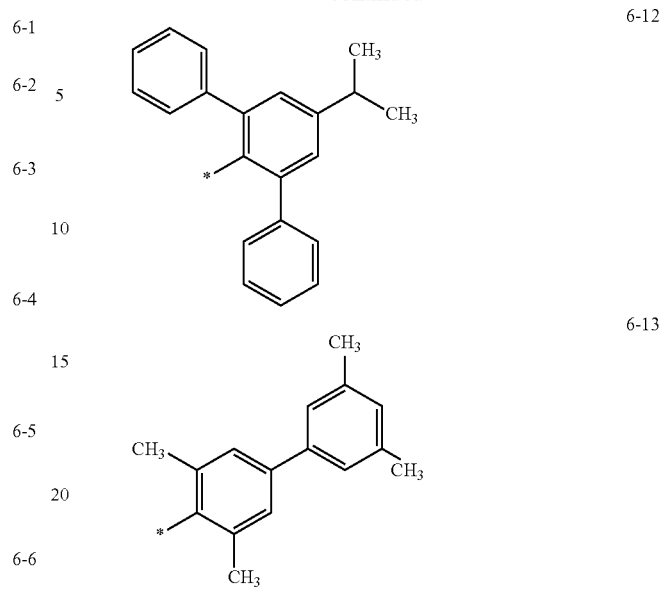

wherein in Formulae 6-1 to 6-13,

* indicates a binding site to a neighboring atom.

a11 in Formula 2 indicates the number of groups $R_{11}$, and a11 may be selected from 1, 2, 3, 4, 5, and 6. When a11 is an integer of 2 or more, groups $R_{11}$ may be identical or different.

In some embodiments, a11 in Formula 2 may be selected from 1, 2, and 3, but is not limited thereto.

a28 in Formula 3 indicates the number of groups $R_{28}$, and a28 may be selected from 1, 2, 3, 4, 5, and 6. When a28 is an integer of 2 or more, groups $R_{28}$ may be identical or different.

In some embodiments, a28 in Formula 2 may be selected from 1, 2, and 3, but is not limited thereto.

a29 in Formula 3 indicates the number of groups $R_{29}$, and a29 may be selected from 1, 2, 3, 4, 5, and 6. When a29 is an integer of 2 or more, groups $R_{29}$ may be identical or different.

In some embodiments, a29 in Formula 2 may be selected from 1, 2, and 3, but is not limited thereto.

$R_{12}$ and $R_{13}$ in Formula 2 may be optionally linked to each other via a divalent linking group selected from a single bond, *—O—*', *—S—*', *—N($Z_{11}$)—*', and *—[C($Z_{11}$)($Z_{12}$)]$_{b11}$—*'. Descriptions regarding $Z_{11}$, $Z_{12}$, and b11 will be described later in this specification.

In some embodiments, $R_{12}$ and $R_{13}$ in Formula 2 may be optionally linked to each other via a divalent linking group selected from a single bond,

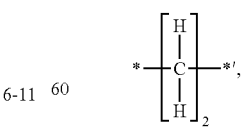

but is not limited thereto.

In some embodiments, $R_{12}$ and $R_{13}$ in Formula 2 may be optionally linked to each other via a divalent linking group represented by

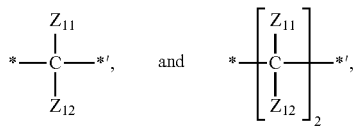

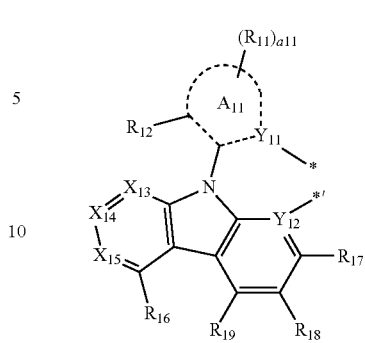

but is not limited thereto.

$Z_{11}$ and $Z_{12}$ may be each independently selected from a hydrogen, a deuterium, —F (a fluoro group), —Cl (a chloro group), —Br (a bromo group), —I (an iodo group), a substituted or unsubstituted $C_1$-$C_{60}$ alkyl group, and a substituted or unsubstituted $C_6$-$C_{60}$ aryl group.

At least one substituent of the substituted $C_1$-$C_{60}$ alkyl group and substituted $C_6$-$C_{60}$ aryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$); wherein $Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, $Z_{11}$ and $Z_{12}$ may be each independently selected from a hydrogen, a deuterium, —F, a methyl group, an ethyl group, a phenyl group, and a naphthyl group, but is not limited thereto.

In some embodiments, $Z_{11}$ and $Z_{12}$ may be each independently selected from a hydrogen, a deuterium, —F, a methyl group, and an ethyl group, but is not limited thereto.

In some embodiments, $Z_{11}$ and $Z_{12}$ may be a hydrogen, but is not limited thereto.

b11 indicates the repetitive number of moieties represented by C($Z_{11}$)($Z_{12}$), and b11 is selected from 1, 2, 3, and 4. When b11 is an integer of 2 or more, moieties represented by C($Z_{11}$)($Z_{12}$) may be identical or different.

In some embodiments, b11 may be selected from 1 and 2, but is not limited thereto.

In some embodiments, b11 may be 2, but is not limited thereto.

In the Formulae above, * and *' may be each independently a binding site to a neighboring atom.

In some embodiments, the first ligand may be represented by Formula 2A below, but is not limited thereto:

Formula 2A wherein in Formula 2A, $A_{11}$ may be selected from a $C_6$-$C_{60}$ cyclic group and $C_1$-$C_{60}$ heterocyclic group, each includes $Y_{11}$ as a cyclic ring member;

$Y_{11}$ and $Y_{12}$ may be each independently selected from a carbon atom (C) and nitrogen atom (N);

$X_{13}$ may be N or $CR_{13}$, $X_{14}$ may be N or $CR_{14}$, and $X_{15}$ may be N or $CR_{15}$;

$R_{11}$ to $R_{19}$ may be each independently selected from a hydrogen, a deuterium, —F (a fluoro group), —Cl (a chloro group), —Br (a bromo group), —I (an iodo group), a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11 may be selected from 1, 2, 3, 4, 5, and 6;

$R_{12}$ and $R_{13}$ may be optionally linked to each other via a divalent linking group selected from a single bond, *—O—*', *—S—*', *—N($Z_{11}$)—*', and *—[C($Z_{11}$)($Z_{12}$)]$_{b11}$—*'; wherein $Z_{11}$ and $Z_{12}$ may be each independently selected from a hydrogen, a deuterium, —F (a fluoro group), —Cl (a chloro group), —Br (a bromo group), —I (an iodo group), and a substituted or unsubstituted $C_1$-$C_{60}$ alkyl group;

b11 may be selected from 1, 2, 3, and 4;

* and *' may be each independently a binding site to a neighboring atom; at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$); wherein $Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, $X_{15}$ in Formula 2A may be $CR_{15}$;
at least one of $R_{11}$ and $R_{15}$ may be a cyano group, but is not limited thereto.
In some embodiments, the first ligand may be represented by at least any one selected from Formulae 2-1 to 2-10 below, but is not limited thereto:
Formula 2-1
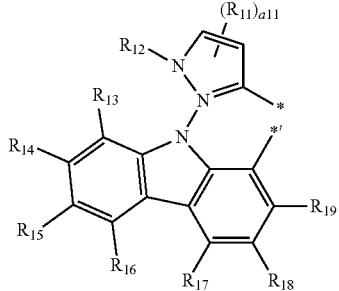
Formula 2-2
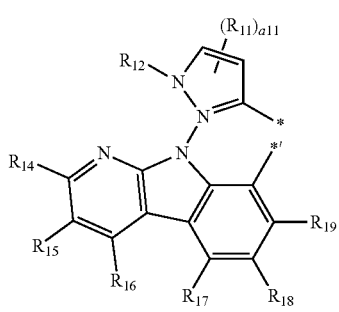
Formula 2-3
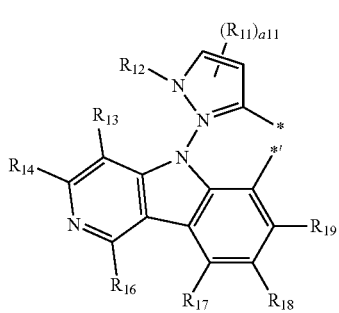
Formula 2-4
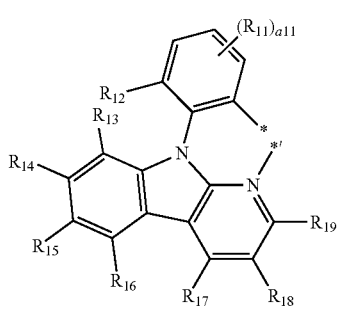
Formula 2-5
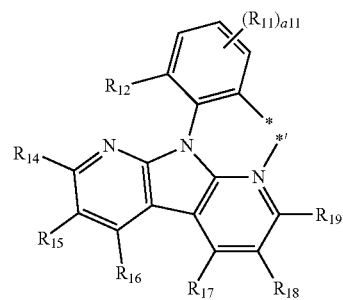
Formula 2-6
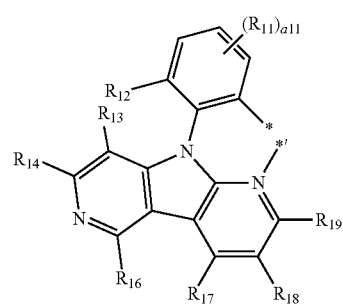
Formula 2-7
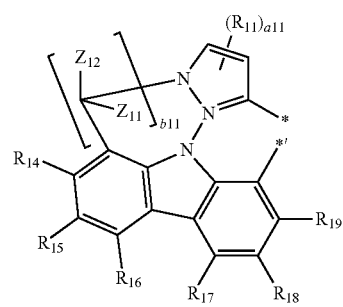
Formula 2-8
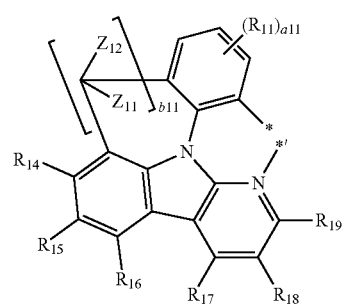
Formula 2-9
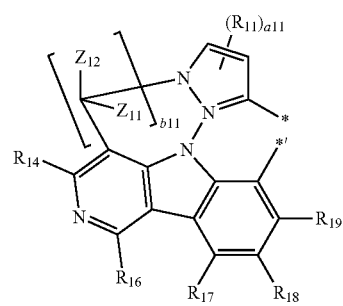

-continued

Formula 2-10

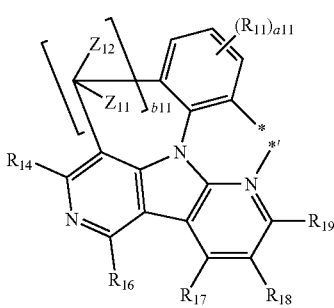

Compound 3A

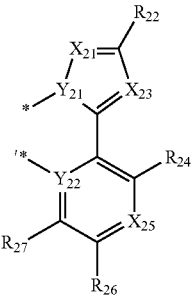

wherein in Formulae 2-1 to 2-10, $R_{11}$ to $R_{19}$ may be each independently selected from a hydrogen, a deuterium, —F (a fluoro group), —Cl (a chloro group), —Br (a bromo group), —I (an iodo group), a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11 may be selected from 1, 2, 3, 4, 5, and 6;

$Z_{11}$ and $Z_{12}$ may be each independently selected from a hydrogen, a deuterium, —F (a fluoro group), —Cl (a chloro group), —Br (a bromo group), —I (an iodo group), and a substituted or unsubstituted $C_1$-$C_{60}$ alkyl group;

b11 may be selected from 1, 2, 3, and 4;

* and *' may be each independently a binding site to a neighboring atom; at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$); wherein $Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, at least one selected from $R_{11}$ to $R_{19}$ in Formulae 2-1 to 2-10 may be a cyano group, but is not limited thereto.

In some embodiments, at least one selected from $R_{11}$ and $R_{15}$ in Formulae 2-1 to 2-10 may be a cyano group, but is not limited thereto.

In some embodiments, at least one selected from $R_{11}$ and $R_{15}$ in Formulae 2-1, 2-2, 2-4, 2-5, 2-7, and 2-8 may be a cyano group, but is not limited thereto.

In some embodiments, the second ligand may be represented by Formula 3A below, but is not limited thereto:

wherein in Formula 3A, $Y_{21}$ and $Y_{22}$ may be each independently selected from a carbon atom (C) and nitrogen atom (N);

$X_{21}$ may be N or $CR_{21}$, $X_{23}$ may be N or $CR_{23}$, and $X_{25}$ may be N or $CR_{25}$;

$R_{21}$ to $R_{27}$ may be each independently selected from a hydrogen, a deuterium, —F (a fluoro group), —Cl (a chloro group), —Br (a bromo group), —I (an iodo group), a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

* and *' may be each independently a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$); wherein $Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, in Formula 3A, $X_{25}$ may be N or $CR_{25}$; $R_{25}$ may be a cyano group, but is not limited thereto.

In some embodiments, the second ligand may be represented by Formula 3-1 below, but is not limited thereto:

Formula 3-1

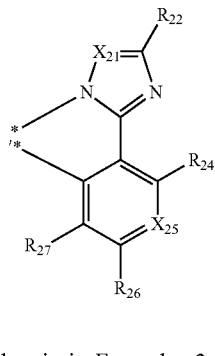

Formula 1-2

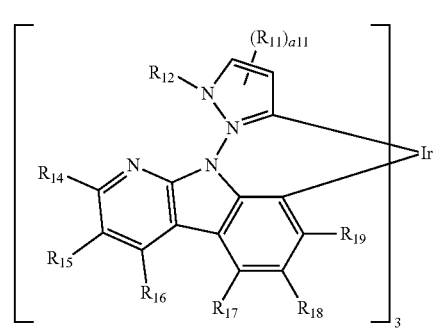

wherein in Formulae 3-1, $X_{21}$ may be N or $CR_{21}$; and $X_{25}$ may be N or $CR_{25}$;

$R_{21}$, $R_{22}$, and $R_{24}$ to $R_{27}$ may be each independently selected from a hydrogen, a deuterium, —F, —Cl, —Br, —I, a cyano group, a $C_1$-$C_{60}$ alkyl group, a $C_1$-$C_{60}$ alkoxy group, a $C_6$-$C_{60}$ aryl group, and a $C_1$-$C_{60}$ heteroaryl group;

a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a deuterium, —F, —Cl, —Br, —I, a methyl group, an ethyl group, a n-propyl group, an iso-propyl group, a n-butyl group, an iso-butyl group, a sec-butyl group, a tert-butyl group, a methoxy group, an ethoxy group, a tert-butoxy group, a phenyl group, a naphthyl group, a pyridinyl group, a pyrimidinyl group, and —Si($Q_{31}$)($Q_{32}$)($Q_{33}$); and a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a phenyl group, a naphthyl group, a pyridinyl group, and a pyrimidinyl group, each substituted with at least one selected from a deuterium, —F, —Cl, —Br, —I, a methyl group, an ethyl group, a phenyl group, a naphthyl group, a pyridinyl group, and a pyrimidinyl group;

a11 may be selected from 1, 2, and 3;

* and *' indicates a binding site to a neighboring atom.

In some embodiments, in Formula 3-1, $X_{25}$ may be N or $CR_{25}$; and $R_{25}$ may be a cyano group, but is not limited thereto.

In some embodiments, the organometallic compound may be represented by any one selected from Formulae 1-1 to 1-8 below, but is not limited thereto:

Formula 1-3

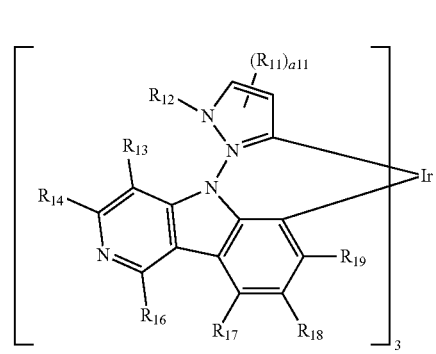

Formula 1-4

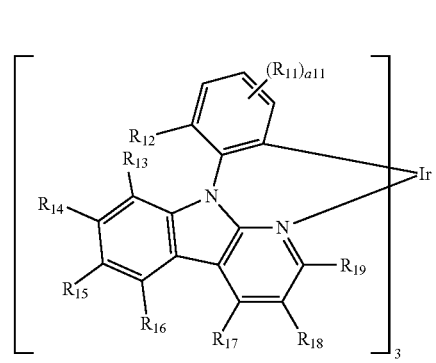

Formula 1-1

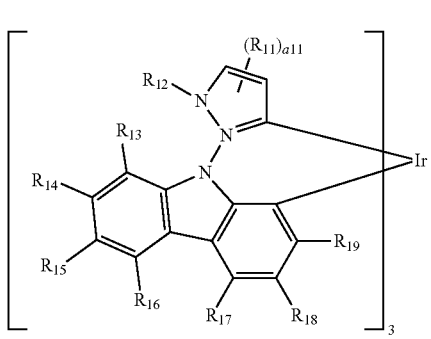

Formula 1-5

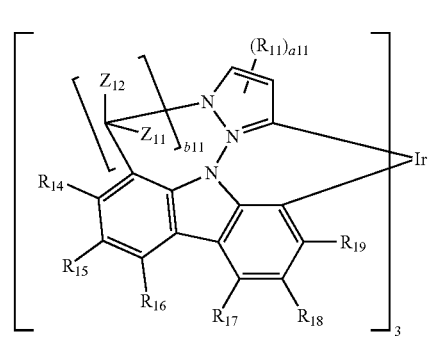

-continued

Formula 1-6

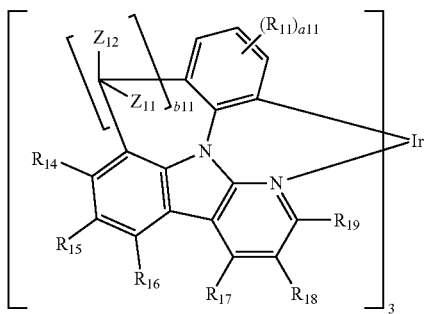

Formula 1-7

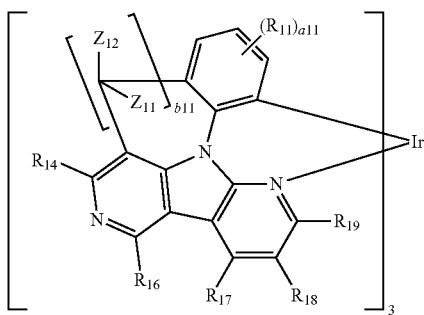

Formula 1-8

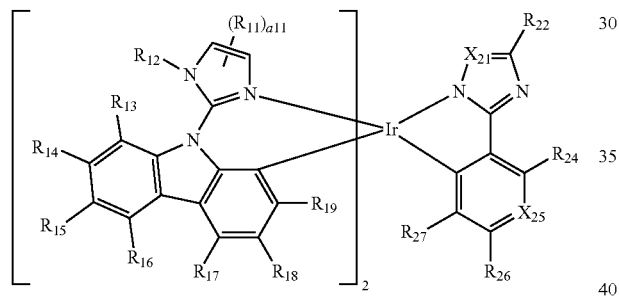

wherein in Formulae 1-1 to 1-8, $X_{21}$ may be N or $CR_{21}$; and $X_{25}$ may be N or $CR_{25}$;

$R_{11}$ to $R_{19}$, $R_{21}$, $R_{22}$, $R_{24}$, and $R_{27}$ may be each independently selected from a hydrogen, a deuterium, —F (a fluoro group), —Cl (a chloro group), —Br (a bromo group), —I (an iodo group), a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11 may be selected from 1, 2, and 3.

In some embodiments, $Z_{11}$ and $Z_{12}$ may be each independently selected from a hydrogen, a deuterium, —F, a methyl group, and an ethyl group;

b11 may be selected from 1 and 2;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group may be selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$);

$Q_{11}$ to $Q_{13}$, $Q_{21}$ to $Q_{23}$, and $Q_{31}$ to $Q_{33}$ may be each independently selected from a $C_1$-$C_{60}$ alkyl group and $C_6$-$C_{60}$ aryl group.

In some embodiments, at least one selected from $R_{11}$ to $R_{19}$ in Formulae 1-1 to 1-8 may be a cyano group, but is not limited thereto.

In some embodiments, the organometallic compound may be represented by any one selected from Compounds 1 to 14 below, but is not limited thereto:

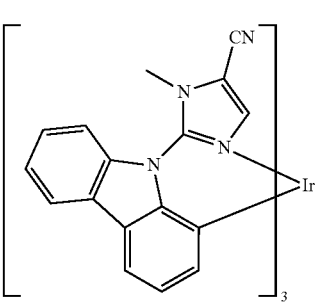

1

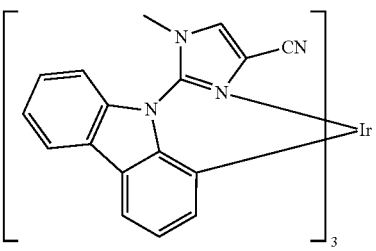

2

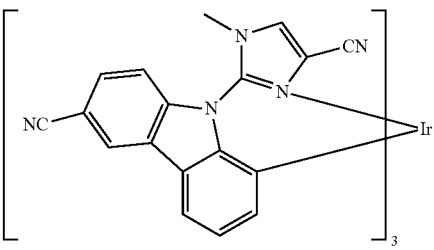

3

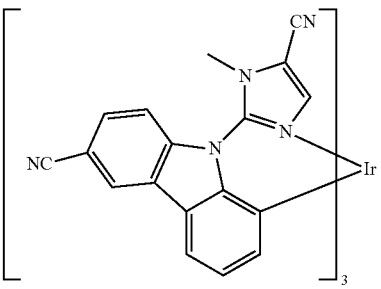

4

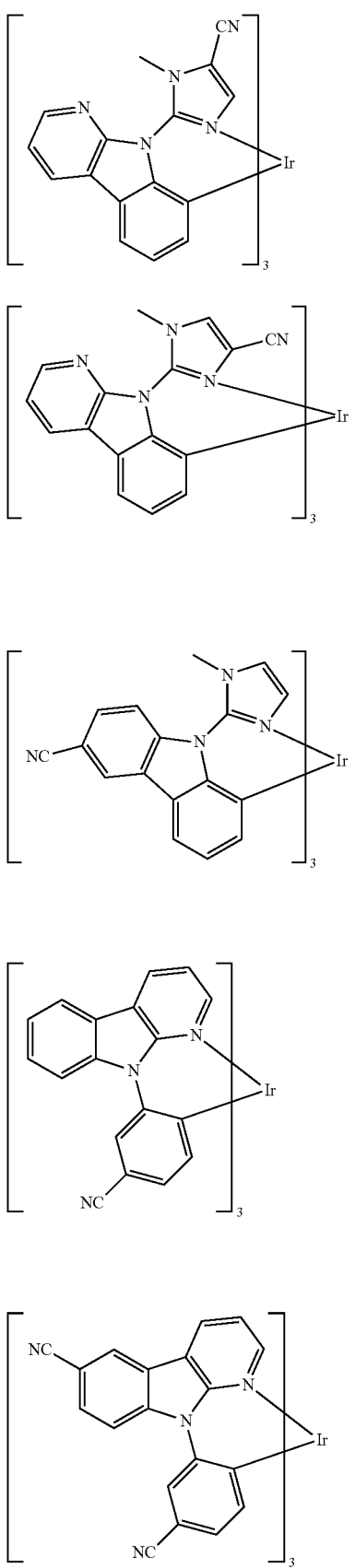
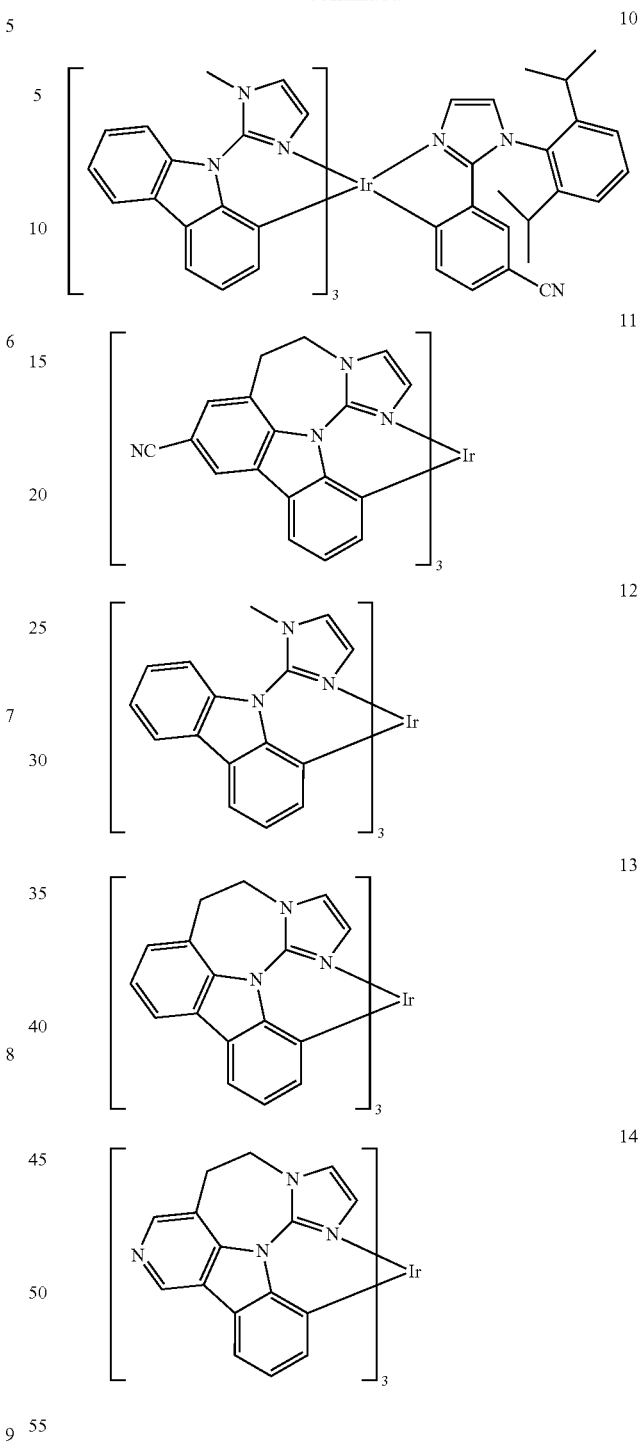

The highest occupied molecular orbital (HOMO) energy level, the lowest unoccupied molecular orbital (LUMO) energy level, energy gap, S1 energy level, T1 energy level, T (dp*) (adiabatic condition), and spin density of the Compounds above were evaluated by using Gaussian 09, which performs molecular structure optimizations by using density functional theory (DFT) based on B3LYP. The results are shown in Table 1 below.

TABLE 1

| No. | HOMO eV | LUMO eV | energy gap eV | S1 eV | S1 nm | S1 f* | T1 (Vertical) eV | T1 (Vertical) nm | T (dp*) (Adiabatic) eV | T (dp*) (Adiabatic) nm | T (dp*) spin density |
|---|---|---|---|---|---|---|---|---|---|---|---|
| 7  | −5.18 | −1.27 | 1.67 | 3.38 | 367 | 0.0037 | 2.89 | 429 | 2.82 | 439 | 0.191 |
| 8  | −5.72 | −2.01 | 2.24 | 3.08 | 402 | 0.0258 | 2.86 | 433 | 2.82 | 440 | 0.241 |
| 9  | −6.31 | −2.66 | 1.96 | 3.04 | 408 | 0.0261 | 2.86 | 434 | 2.82 | 440 | 0.287 |
| 10 | −4.66 | −0.80 | 1.77 | 3.16 | 392 | 0.0051 | 2.84 | 436 | 2.89 | 428 | 0.150 |
| 11 | −5.01 | −1.22 | 2.34 | 3.29 | 377 | 0.1227 | 2.84 | 437 | 1.82 | 440 | 0.187 |
| 12 | −4.51 | −0.44 | 1.55 | 3.54 | 350 | 0.0147 | 2.96 | 418 | 2.87 | 432 | 0.174 |
| 13 | −4.35 | −0.33 | 1.98 | 3.49 | 355 | 0.0178 | 2.94 | 422 | 2.86 | 433 | 0.168 |
| 14 | −4.74 | −0.66 | 1.91 | 3.53 | 351 | 0.0206 | 2.98 | 416 | 2.89 | 429 | 0.172 | f: Oscillator strength.

The organometallic compound represented by Formula 1 includes a partial structure having high hole transport ability and a partial structure having high electron transport ability, and thus charge balance may be adjusted in an emission layer.

The organometallic compound represented by Formula 1 includes iridium (Ir) so as to form an octahedral structure. Thus, a possibility of stacking may be low. Accordingly, the organometallic compound represented by Formula 1 may provide an organic light-emitting device having reduced shift of the emission wavelength and high stability.

A method of synthesizing the organometallic compound represented by Formula 1 may be apparent to one of ordinary skill in the art by referring to Synthesis Examples used herein.

The organic light-emitting device may include:
a first electrode;
a second electrode; and
an organic layer disposed between the first electrode and the second electrode,
wherein the organic layer may include an emission layer and at least one organometallic compound represented by Formula 1.

The organometallic compound represented by Formula 1 may be used in an organic layer of the light-emitting device. For example, the organometallic compound represented by Formula 1 may act as a dopant of an emission layer in the organic layer, but is not limited thereto.

Since the organic light-emitting device has an organic layer including the organometallic compound represented by Formula 1, the organic light-emitting device may have a low driving voltage, high efficiency, high brightness, long lifespan, and high color purity characteristics.

The organic light-emitting device including the organometallic compound may emit deep blue light.

The organometallic compound represented by Formula 1 may be used in a pair of electrodes in an organic light-emitting device. For example, the organometallic compound represented by Formula 1 may be included in the emission layer. In this regard, the organometallic compound acts as a dopant and the emission layer may further include a host (in other words, an amount of the organometallic compound represented by Formula 1 may be smaller than an amount of the host).

As used herein, the expression the "(organic layer) includes at least one organometallic compound" may be construed as meaning the "(organic layer) may include one organometallic compound in a range of Formula 1 or two different organometallic compounds in a range of Formula 1".

For example, the organic layer may include only Compound 1 as the organometallic compound. In this regard, Compound 1 may be included in the emission layer of the organic light-emitting device. Alternatively, the organic layer may include Compound 1 and Compound 2 as the organometallic compounds. In this regard, Compound 1 and Compound 2 may be included in the same layer (for example, Compound 1 and Compound 2 may all be included in the emission layer).

The first electrode may be anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

For example, the first electrode may be an anode, the second electrode may be a cathode, and the organic layer may include:

i) a hole-transport region disposed between the first electrode and the emission layer, wherein the hole-transport region may include at least one selected from a hole injection layer, a hole-transport layer, and an electron blocking layer; and ii) an electron-transport region disposed between the emission layer and the second electrode, wherein the electron-transport region may include at least one selected from a hole blocking layer, an electron transport layer, and an electron injection layer.

As used herein, the term the "organic layer" refers to a single and/or a plurality of layers disposed between the first electrode and the second electrode in an organic light-emitting device. The "organic layer" may include not only organic compounds but also organometallic complexes including metals.

FIG. 1 is a schematic view of an organic light-emitting device 10 according to an embodiment. Hereinafter, a structure and a method of manufacturing the organic light-emitting device according to an embodiment will be described with reference to FIG. 1. The organic light-emitting device 10 includes a first electrode 11, an organic layer 15, and a second electrode 19, which are sequentially layered in the stated order.

A substrate may be additionally disposed under the first electrode 11 or on the second electrode 19. The substrate may be a related substrate that is used in an organic light-emitting device, such as glass substrate or a transparent plastic substrate, each having excellent mechanical strength, thermal stability, transparency, surface smoothness, ease of handling, and water repellency.

The first electrode 11 may be formed by depositing or sputtering a material for forming the first electrode 11 on the substrate. The first electrode 11 may be an anode. The material for the first electrode 11 may be selected from materials with a high work function for an easy hole injection. The first electrode 11 may be a reflective electrode, a semi-transmissive electrode, or a transmissive electrode. The material for the first electrode 110 may be selected from indium tin oxide (ITO), indium zinc oxide (IZO), tin oxide ($SnO_2$), and zinc oxide (ZnO). Alternatively, the material for the first electrode 110 may be selected from a metal or a metal alloy such as magnesium (Mg), aluminum (Al), aluminum-lithium (Al—Li), calcium (Ca), magnesium-indium (Mg—In), and magnesium-silver (Mg—Ag).

The first electrode 11 may have a single layer structure or a multi-layer structure including two or more layers. For example, the first electrode 11 may have a triple-layer structure of ITO/Ag/ITO, but it is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, hole transport layer, electron blocking layer, and buffer layer.

The hole transport region may only include a hole injection layer or a hole transport layer. Alternatively, the hole transport region may include a structure in which a hole injection layer/a hole transport layer or a hole injection layer/a hole transport layer/an electron blocking layer are sequentially layered on the first electrode 11.

When the hole transport region includes a hole injection layer, the hole injection layer (HIL) may be formed on the first electrode 11 by using various methods such as vacuum deposition, spin coating, casting, and Langmuir-Blodgett (LB) method.

When a hole injection layer is formed by vacuum deposition, for example, the vacuum deposition may be performed at a deposition temperature in a range of about 100 to about 500° C., at a vacuum degree in a range of about $10^{-8}$ to about $10^{-3}$ torr, and at a deposition rate in a range of about 0.01 Angstroms per second (Å/sec) to about 100 Å/sec, though the conditions may vary depending on a compound that is used as a hole injection material and a structure and thermal properties of a desired hole injection layer, but is not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C. for removing a solvent after the spin coating, though the conditions may vary depending on a compound that is used as a hole injection material and a structure and thermal properties of a desired HIL, but is not limited thereto.

The conditions for forming a hole transport layer and an electron blocking layer may be inferred based on the conditions for forming the hole injection layer.

The hole transport region may include at least one selected from m-MTDATA, TDATA, 2-TNATA, NPB, 3-NPB, TPD, a spiro-TPD, a spiro-NPB, α-NPB, TAPC, HMTPD, 4,4',4''-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below, and a compound represented by Formula 202 below:

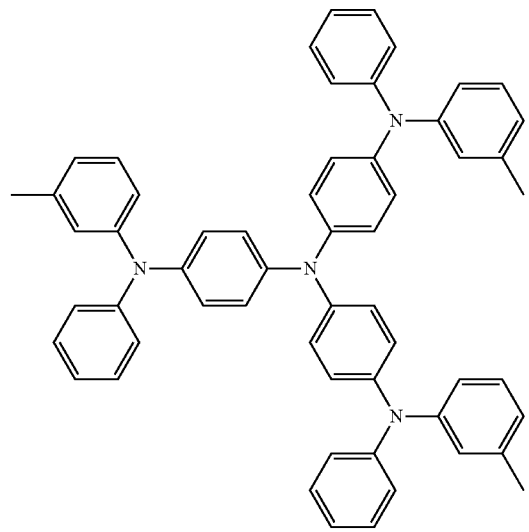

m-MTDATA

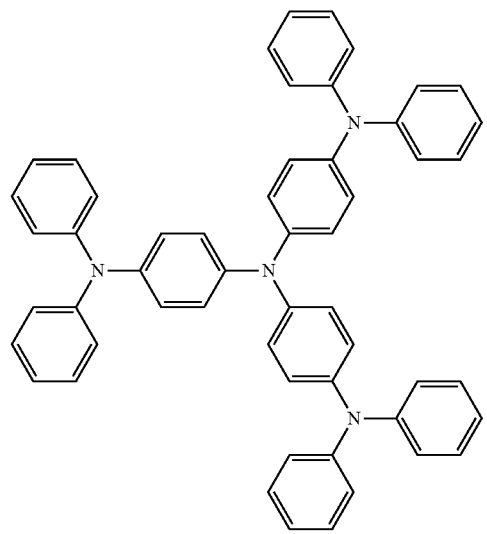

TDATA

-continued
2-TNATA
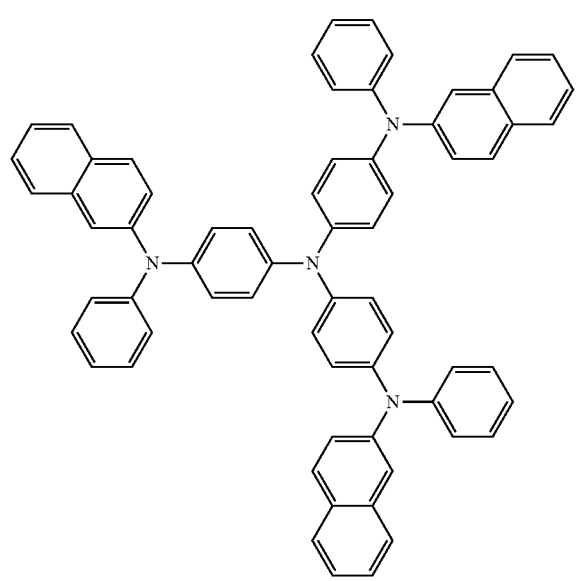
NPB
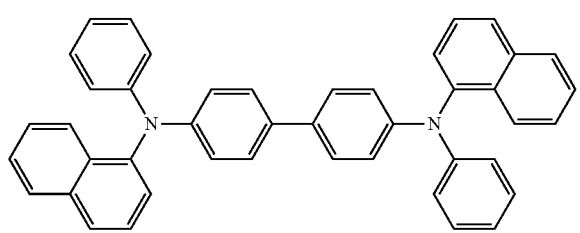
β-NPB
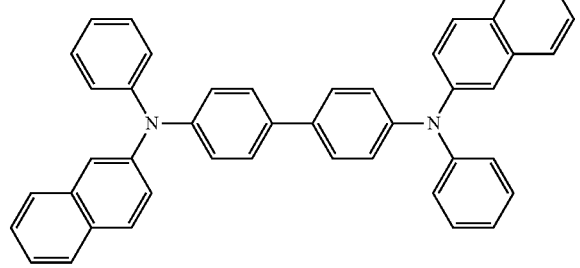
TPD
Spiro-TPD
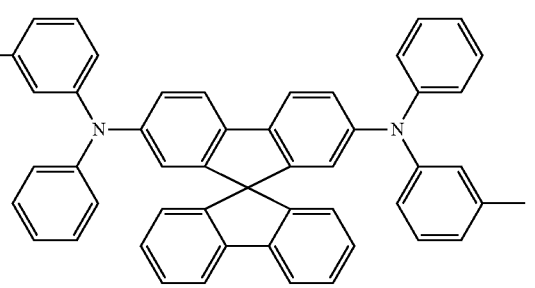
Spiro-NPB
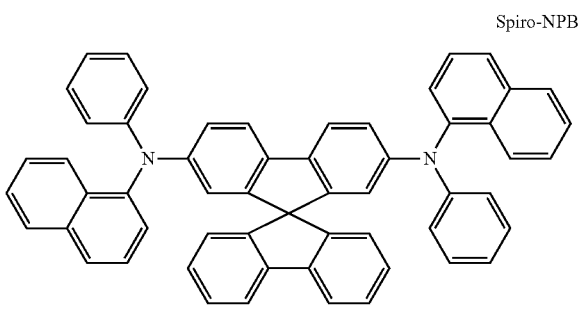
α-NPB
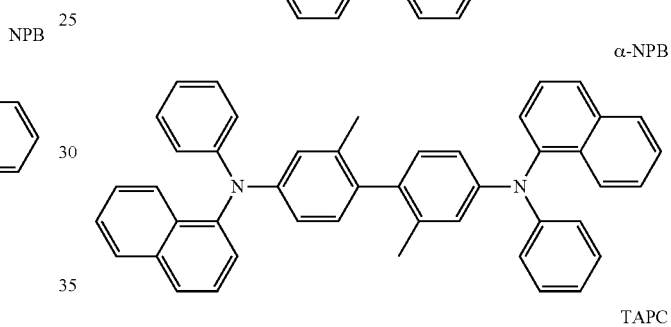
TAPC
HMTPD
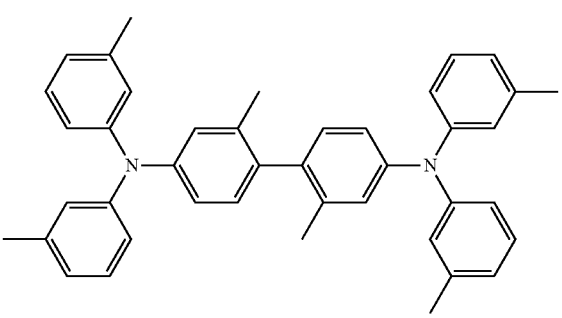

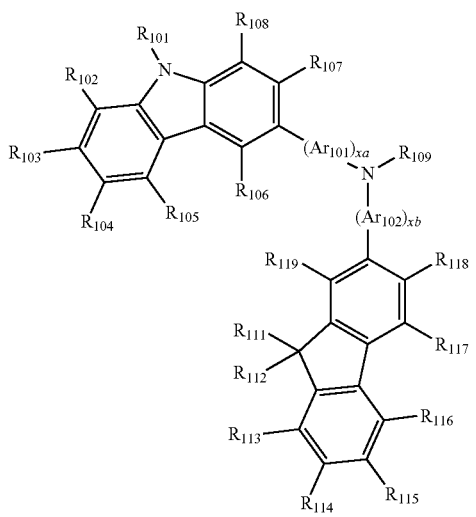

Formula 201

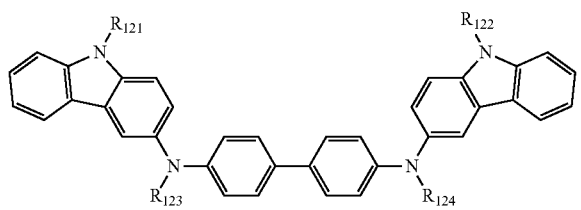

Formula 202

$Ar_{101}$ and $Ar_{102}$ in Formula 201 may be each independently selected from a phenylene, a pentalenylene, an indenylene, a naphthylene, an azulenylene, a heptalenylene, an acenaphthylene, a fluorenylene, a phenalenylene, a phenanthrenylene, an anthracenylene, a fluoranthenylene, a triphenylenylene, a pyrenylene, a chrysenylenylene, a naphthacenylene, a picenylene, a perylenylene, and a pentacenylene; and a phenylene, a pentalenylene, an indenylene, a naphthylene, an azulenylene, a heptalenylene, an acenaphthylene, a fluorenylene, a phenalenylene, a phenanthrenylene, an anthracenylene, a fluoranthenylene, a triphenylenylene, a pyrenylene, a chrysenylenylene, a naphthacenylene, a picenylene, a perylenylene, and a pentacenylene, each substituted with at least one selected from a deuterium, a halogen atom, a hydroxyl group, a cyano group, a nitro group, an amino group an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_1$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{60}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may be each independently an integer of 0 to 5, or 0, 1, or 2. In some embodiments, xa may be 1 and xb may be 0, but they are not limited thereto.

In Formulae 201 and 202, $R_{101}$ to $R_{108}$, $R_{111}$ to $R_{119}$, and $R_{121}$ to $R_{124}$ may be each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, and a hexyl group) and a $C_1$-$C_{10}$ alkoxy group (for example, a methoxy group, an ethoxy group, a propoxy group, a butoxy group, and a pentoxy group);

a $C_1$-$C_{10}$ alkyl group and a $C_1$-$C_{10}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from a $C_1$-$C_{10}$ alkyl group and a $C_1$-$C_{10}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, but they are not limited thereto.

$R_{109}$ in Formula 201 may be one of a phenyl group, a naphthyl group, an anthracenyl group, a biphenyl group, and a pyridinyl group; and a phenyl group, a naphthyl group, an anthracenyl group, a biphenyl group, and a pyridinyl group, each substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group.

In some embodiments, the compound represented by Formula 201 may be represented by Formula 201A, but is not limited thereto:

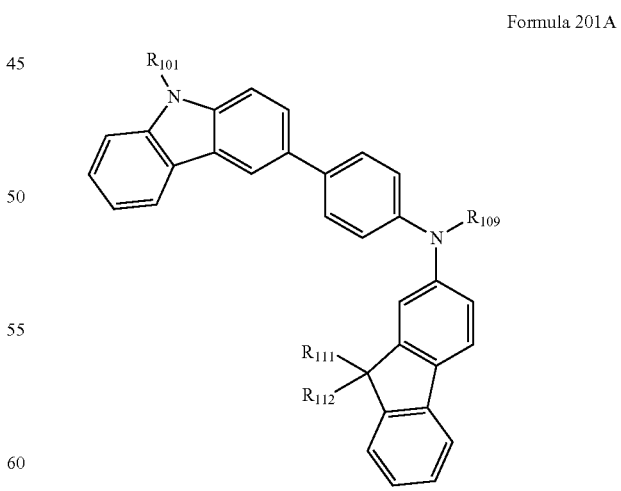

Formula 201A

Descriptions of R101, R111, R112, and R109 in Formula 201A are the same as described above.

For example, the compound represented by Formula 201 and the compound represented by Formula 202 may include Compounds HT1 to HT20, but they are not limited thereto:

HT1
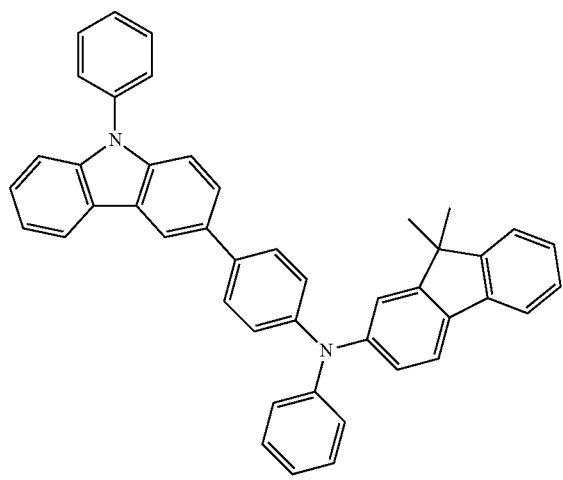
HT2
HT3
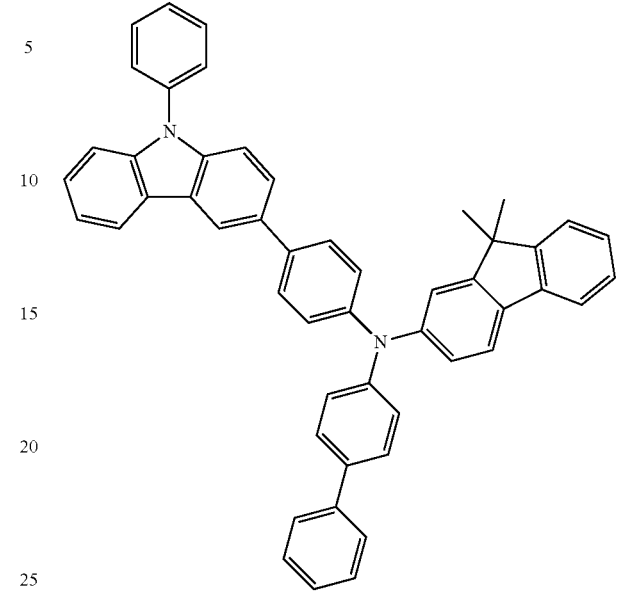
HT4
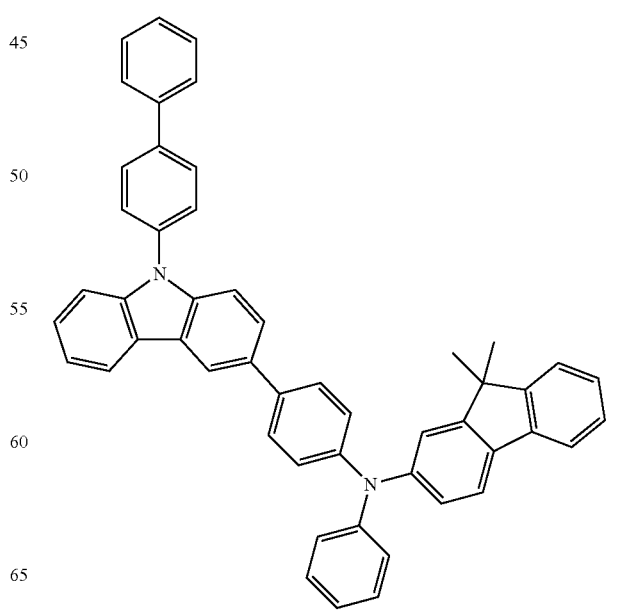

HT5
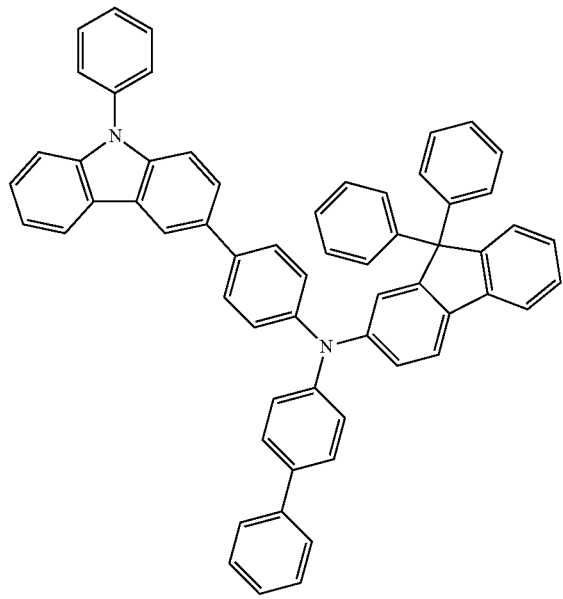
HT7
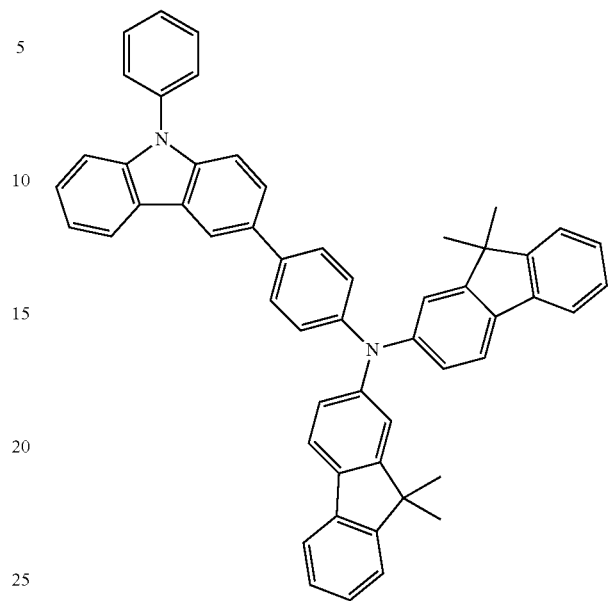
HT6
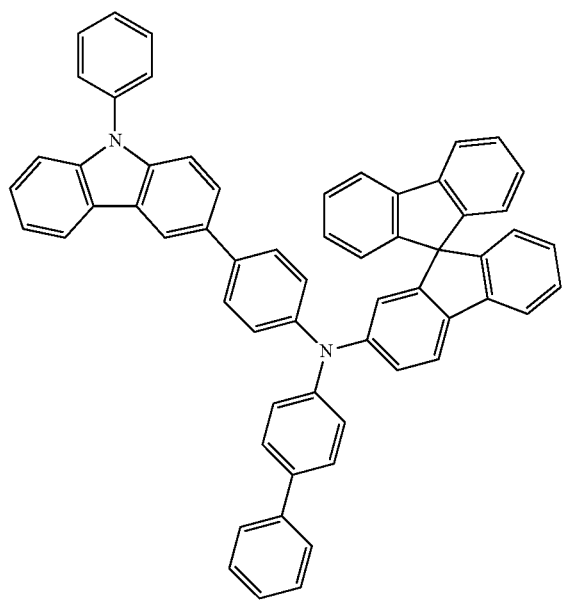
HT8
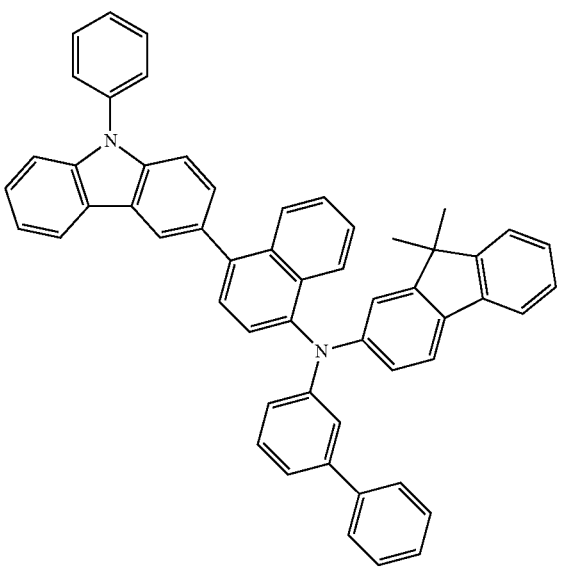

HT9
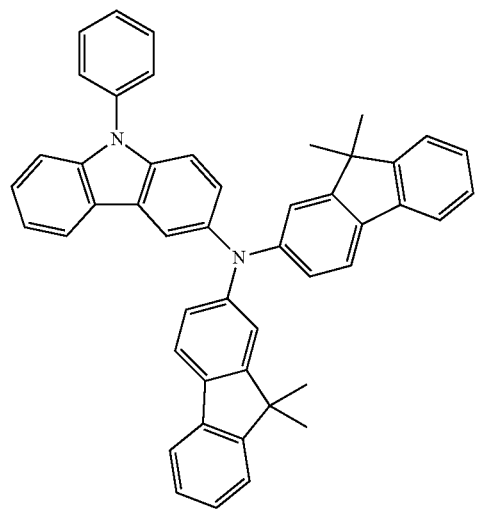
HT11
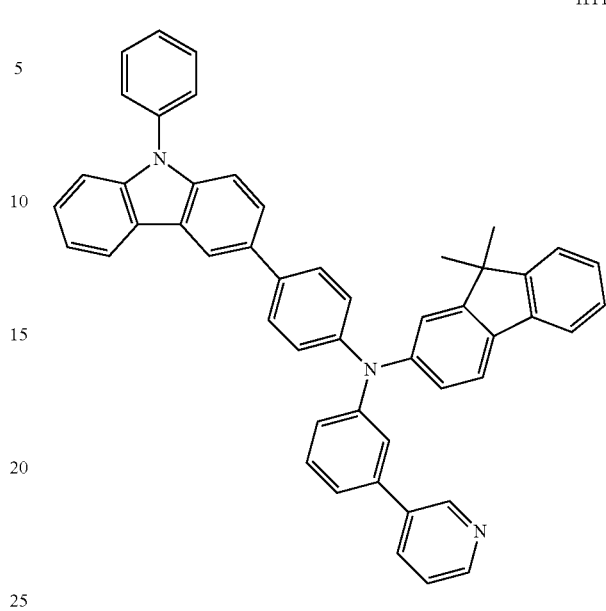
HT10
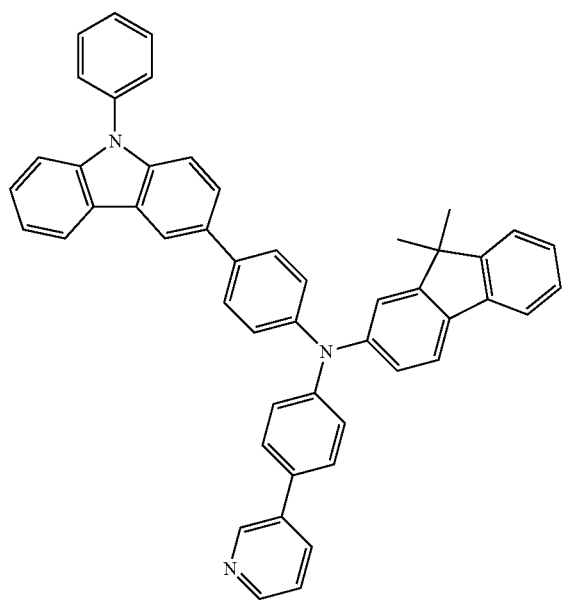
HT12
HT13
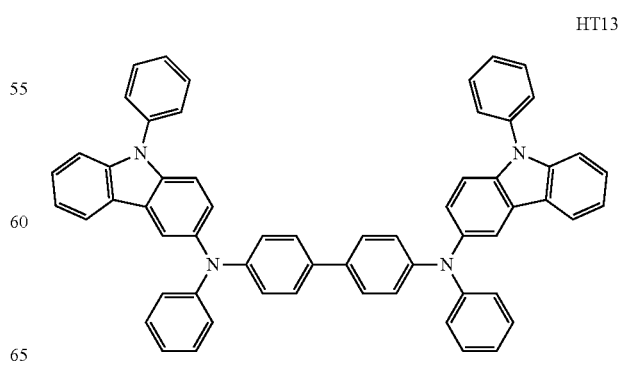

HT14
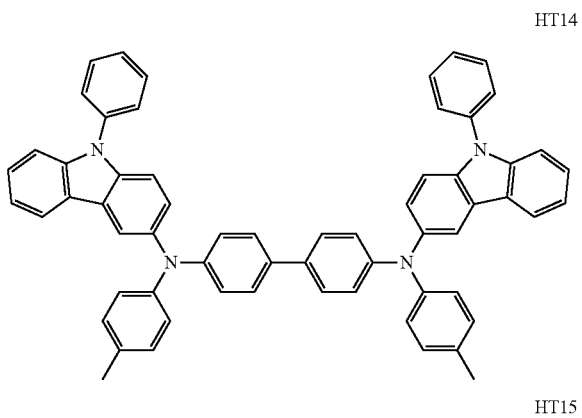

HT15
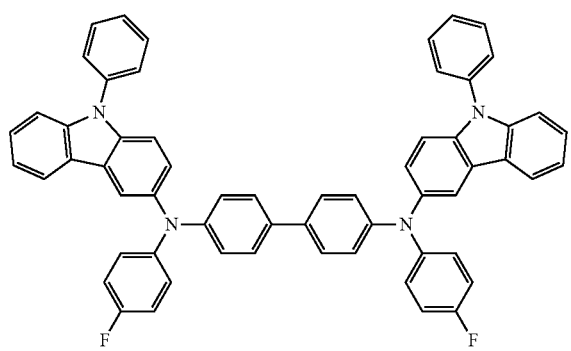

HT16
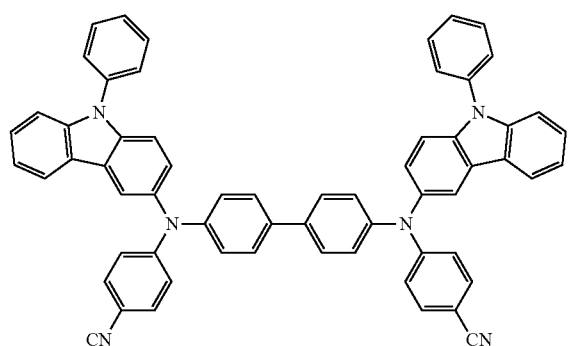

HT17
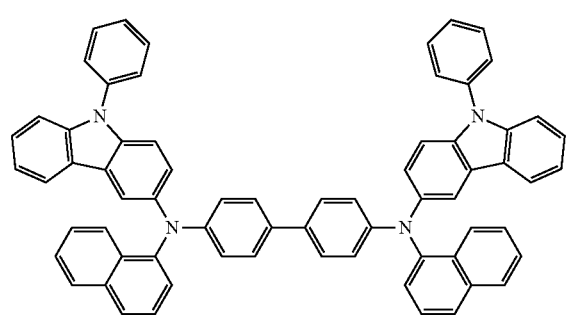

HT18
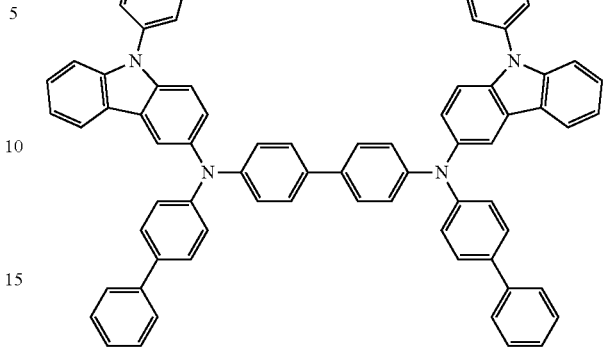

HT19
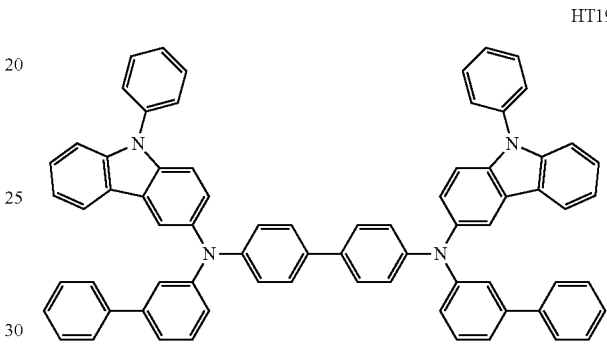

HT20
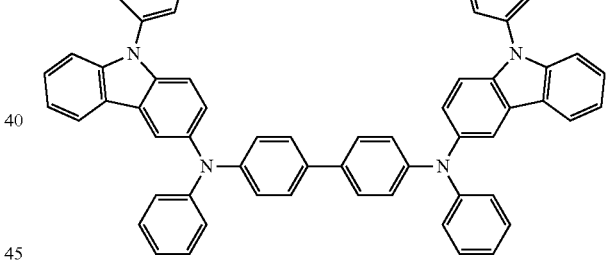

A thickness of the hole transport region may be in a range of about 100 Angstroms (Å) to about 10,000 Å, for example, about 100 Å to about 1,000 Å. When the hole transport region includes the a hole injection layer and a hole transport layer, a thickness of the hole injection layer may be in a range of about 100 Å to about 10,000 Å, for example, about 100 Å to about 1,000 Å, a thickness of the hole transport layer may be in a range of about 50 Å to about 2,000 Å, for example, about 100 Å to about 1,500 Å. When the thicknesses of the hole transport region, the hole injection layer, and the hole transport layer are within the ranges described above, satisfactory hole transporting properties may be obtained without a substantial increase in a driving voltage.

The hole transport region may further include, in addition to the mentioned materials above, a charge-generating material to improve conductive properties. The charge-generating material may be homogeneously or non-homogeneously dispersed throughout the hole transport region.

The charge-generating material may be, for example, a p-dopant. The p-dopant may be one selected from a quinone derivative, a metal oxide, and a cyano group-containing compound, but is not limited thereto. For example, non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1 illustrated below, but they are not limited thereto.

Compound HT-D1

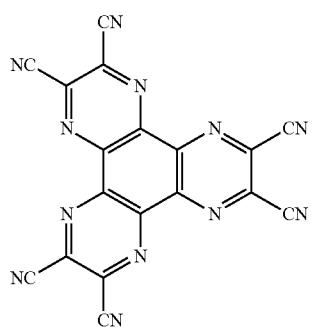

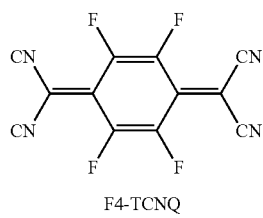

F4-TCNQ

The hole transport region may further include a buffer layer.

The buffer layer may compensate for an optical resonance distance according to a wavelength of light emitted from the emission layer to improve the efficiency of an organic light-emitting device.

An emission layer (EML) may be formed on the hole transport region by using various methods, such as vacuum deposition, spin coating, casting, or an LB method. When the emission layer is formed by vacuum deposition or spin coating, deposition and coating conditions for the emission layer may be generally similar to the conditions for forming a hole injection layer, though the conditions may vary depending on the compound used.

The emission layer may include a host and a dopant and the dopant may include the organometallic compound represented by Formula 1.

The host may include at least one selected from TPBi, TBADN, AND (also known as "DNA"), CBP, CDBP, and TCP:

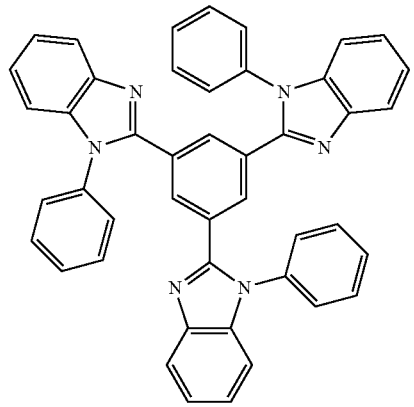

TPBi

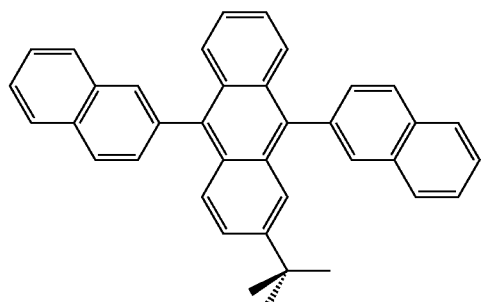

TBADN

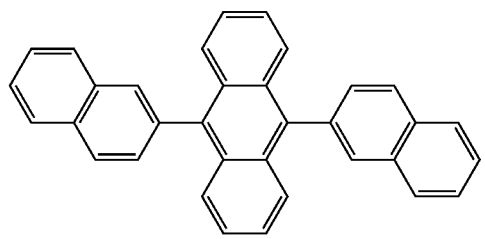

ADN

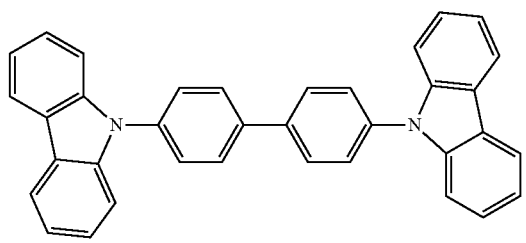

CBP

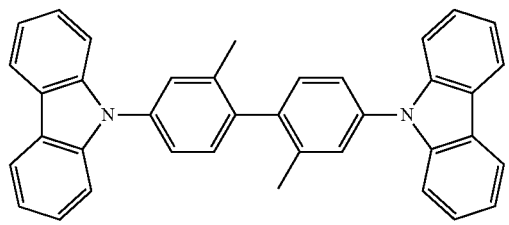

CDBP

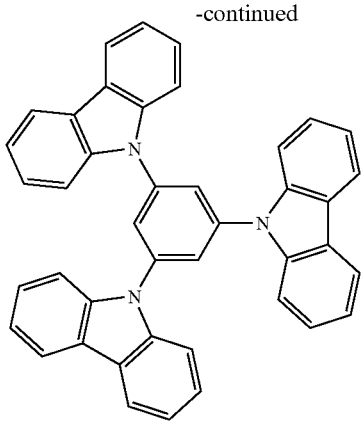

TCP

Alternatively, the host may further include a compound represented by Formula

Formula 301

Ar$_{114}$—(Ar$_{112}$)$_h$—[anthracene with (Ar$_{115}$)$_i$ and (Ar$_{116}$)$_j$]—(Ar$_{111}$)$_g$—Ar$_{113}$ Ar$_{111}$ and Ar$_{112}$ in Formula 301 may be each independently selected from a phenylene, a naphthylene, a phenanthrenylene, and a phenylene, a naphthylene, a phenanthrenylene, a fluorenyl group, and a pyrenylene, each substituted with at least one selected from a pyrenylene; and a phenyl group, a naphthyl group, and an anthracenyl group.

Ar$_{113}$ to Ar$_{116}$ in Formula 301 may be each independently selected from a $C_1$-$C_{10}$ alkyl group; a phenyl group, a naphthyl group, a phenanthrenyl group and a pyrenyl group; and a phenyl group, a naphthyl group, a phenanthrenyl group, a fluorenyl group, and a pyrenyl group, each substituted with at least one selected from a phenyl group, a naphthyl group, and an anthracenyl group.

g, h, i, and j in Formula 301 may be each independently an integer of 0 to 4, for example, 0, 1, or 2.

Ar$_{113}$ and Ar$_{116}$ in Formula 301 may be each independently selected from a $C_1$-$C_{10}$ alkyl group, each substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from a deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

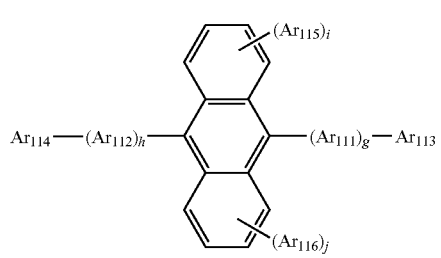

but they are not limited thereto.

Alternatively, the host may include a compound represented by Formula 302:

Formula 302

[structure with Ar$_{122}$, Ar$_{126}$, Ar$_{127}$, (Ar$_{125}$)$_k$, (Ar$_{124}$)$_l$, Ar$_{123}$]

Descriptions for Ar$_{122}$ to Ar$_{125}$ in Formula 302 may be understood by referring to in connection with the descriptions for Ar$_{113}$ in Formula 301 above.

Ar$_{126}$ and Ar$_{127}$ in Formula 302 may be each independently a $C_1$-$C_{10}$ alkyl group (for example, a methyl group, an ethyl group, or a propyl group).

k and l in Formula 302 may be each independently an integer of 0 to 4. For example, k and l may be 0, 1, or 2.

For example, the compound represented by Formula 201 and the compound represented by Formula 302 may include Compounds HT1 to HT42, but they are not limited thereto:

H1

H2

H3
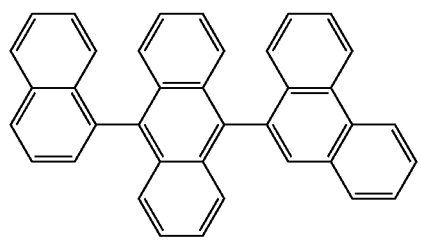
H4
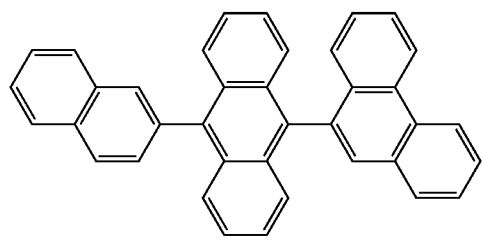
H5
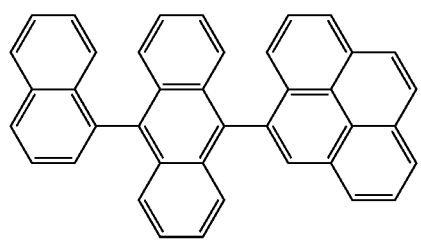
H6
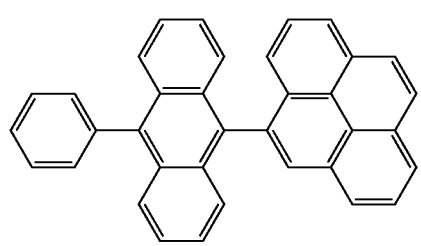
H7
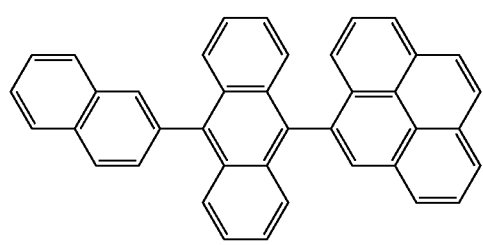
H8
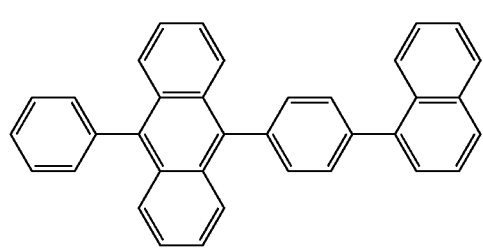
H9
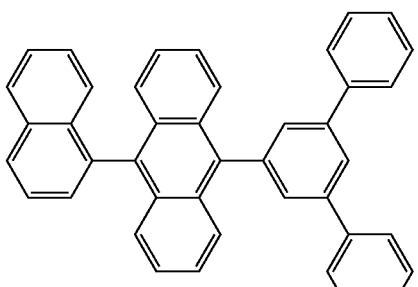
H10
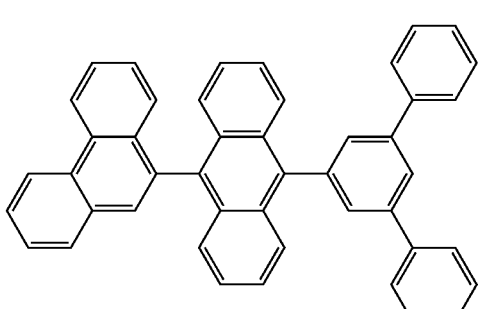
H11
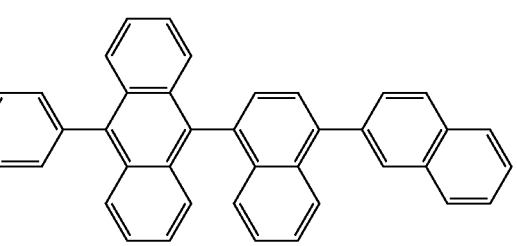
H12
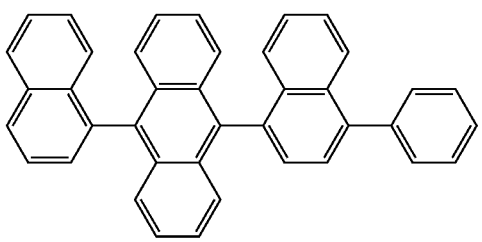
H13
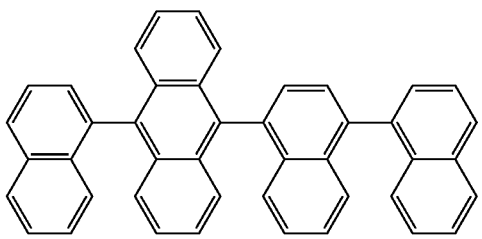
H14
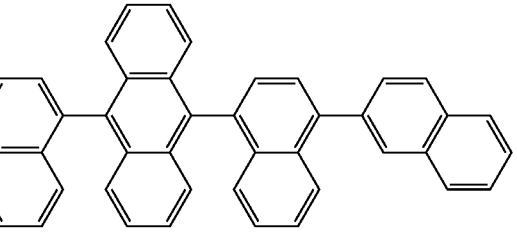

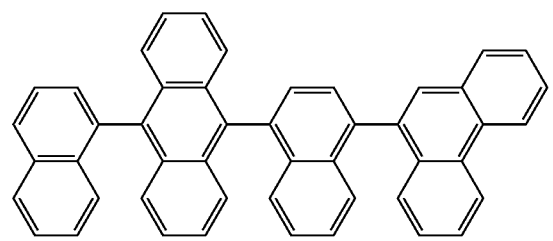

H25
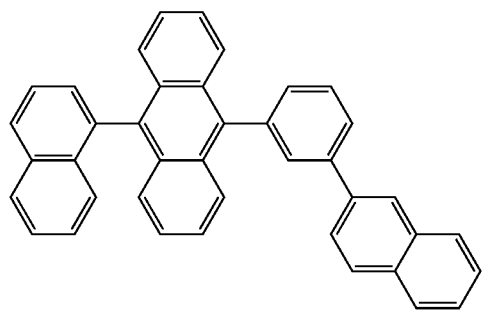
H26
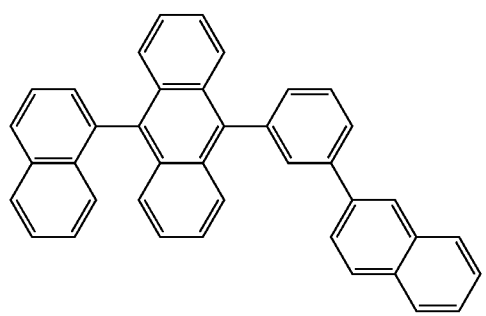
H27
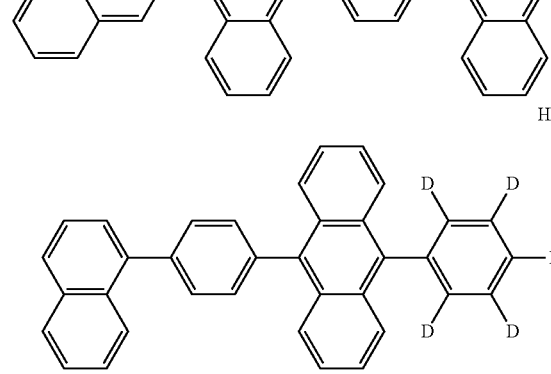
H31
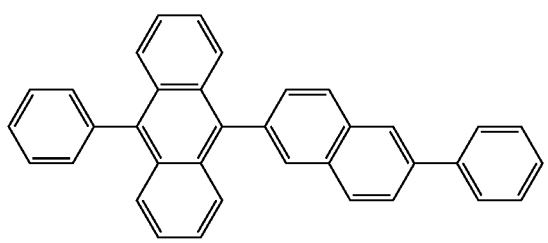
H32
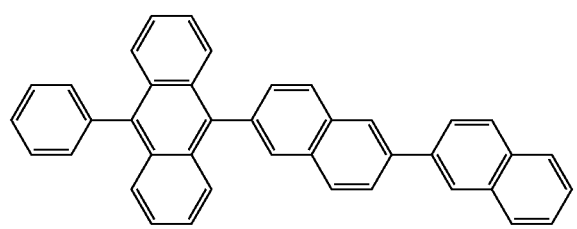
H33
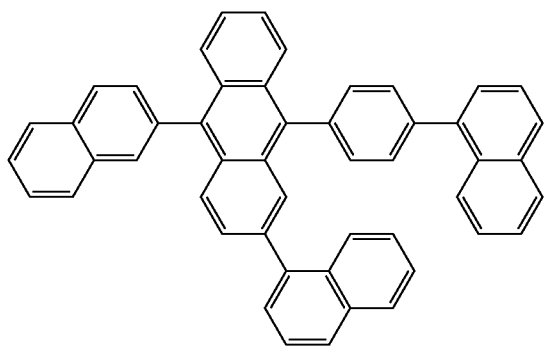
H28
H29
H30
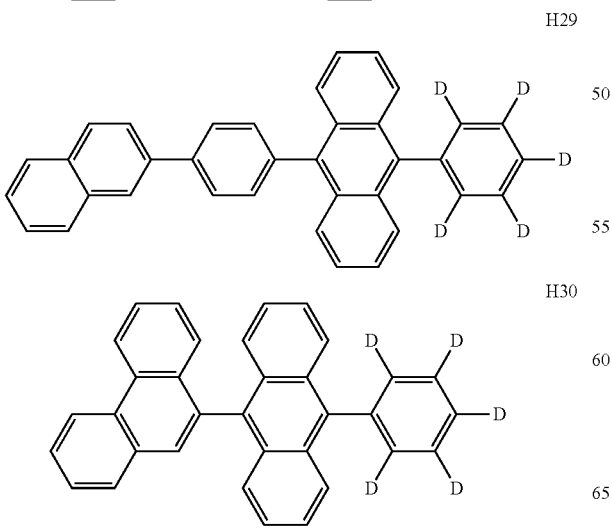
H34
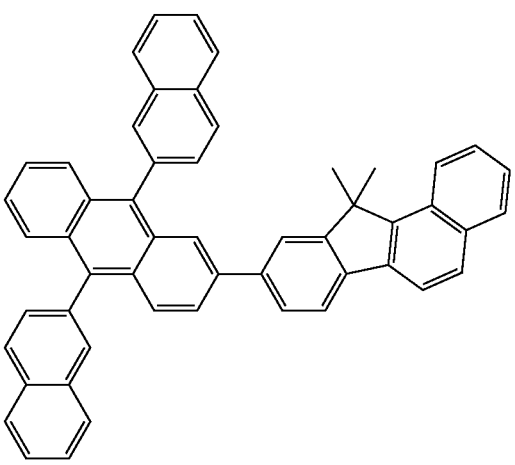

H35
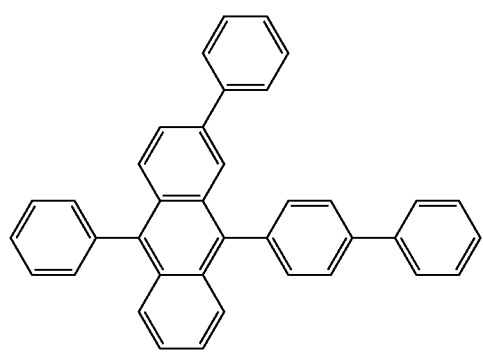
H36
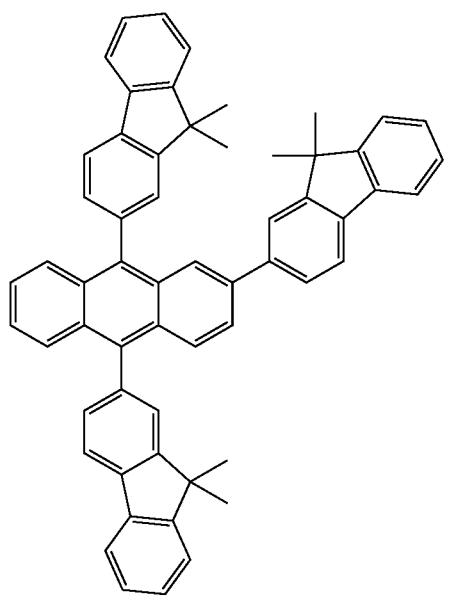
H37
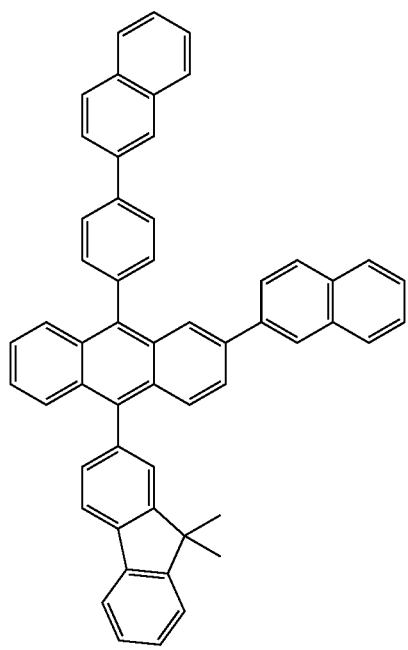
H38
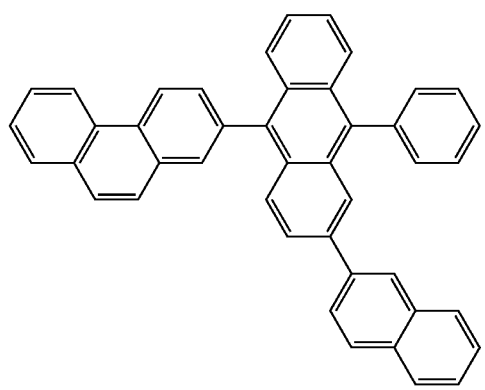
H39
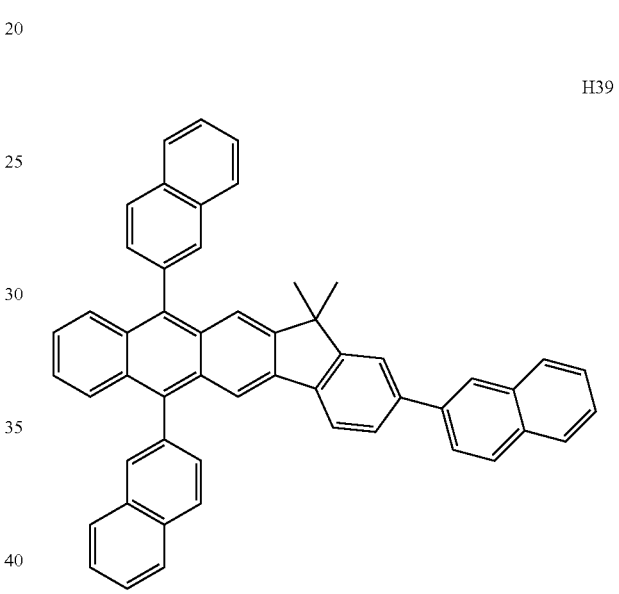
H40
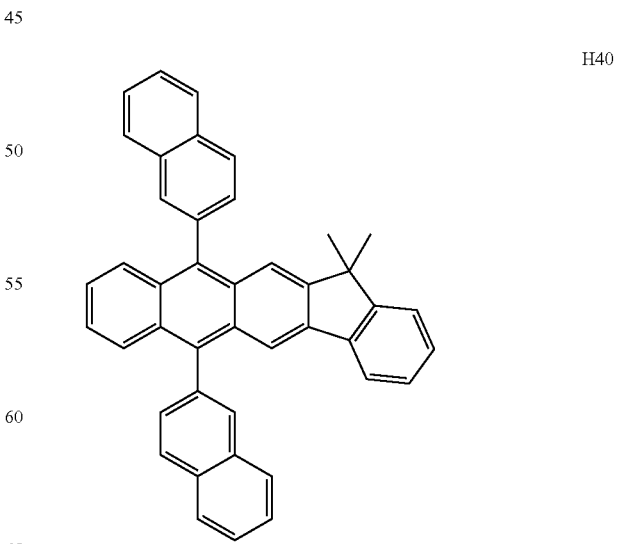

-continued

H41

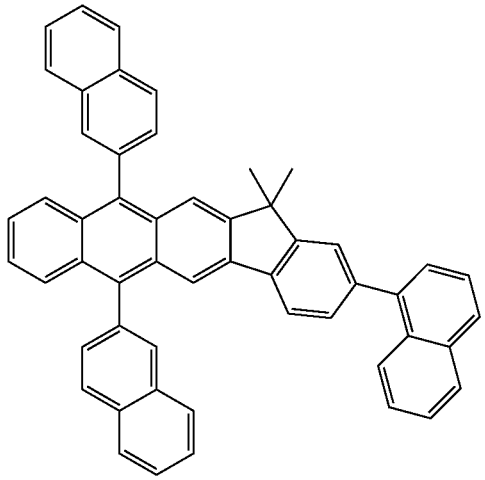

H42

When the organic light-emitting device is a full color organic light-emitting device, the emission layer may be patterned into a red emission layer, a green emission layer, and a blue emission layer. Alternatively, the emission layer may have a structure in which the red emission layer, the green emission layer, and/or the blue emission layer are layered to emit white light or other various embodiments are possible.

When the emission layer includes the host and the dopant, an amount of the dopant may be selected from in a range of about 0.01 to about 15 parts by weight based on about 100 parts by weight of the host, but the amount is not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer, but is not limited thereto.

For example, the electron transport region may have a structure of a hole blocking layer/an electron transport layer/an electron injection layer or an electron transport layer/an electron injection layer, but it is not limited thereto. The electron transport layer may have a single layer structure or a multi-layer structure including two or more different materials.

The conditions for forming a hole blocking layer, an electron transport layer, and an electron injection layer may be inferred based on the conditions for forming the hole injection layer.

When the electron transport region includes an hole blocking layer, the hole blocking layer may, for example, include at least one of BCP and Bphen, but is not limited thereto.

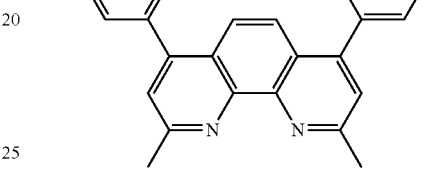

BCP

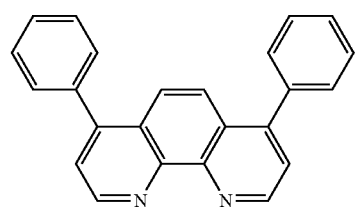

Bphen

A thickness of the hole blocking layer may be in a range of about 20 Å to about 1,000 Å, for example, about 30 Å to about 300 Å. When the thickness of the hole blocking layer is within this range, excellent hole blocking characteristics may be obtained without a substantial increase in driving voltage.

The electron transport layer may include at least one of BCP and Bphen, and may further include at least one of Alq3, Balq, TAZ, and NTAZ.

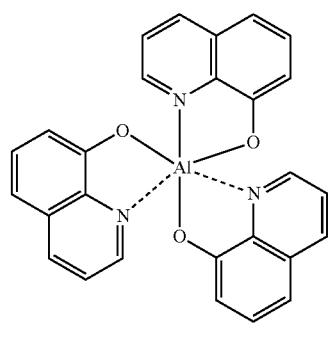

Alq3

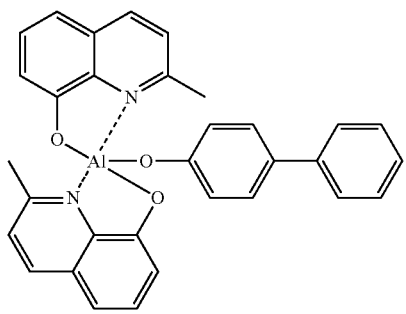

BAlq

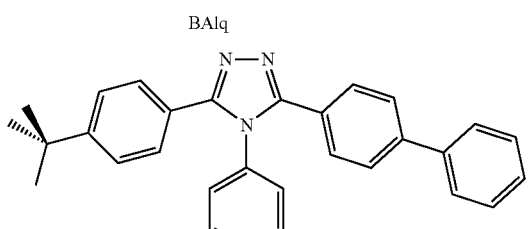

TAZ

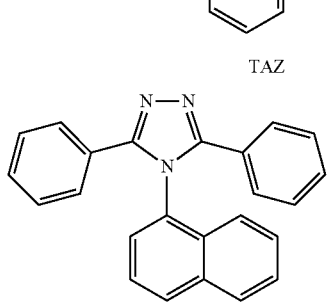

NTAZ

Alternatively, the electron transport layer may include at least one selected from Compounds ET1 and ET2, but is not limited thereto.

ET1

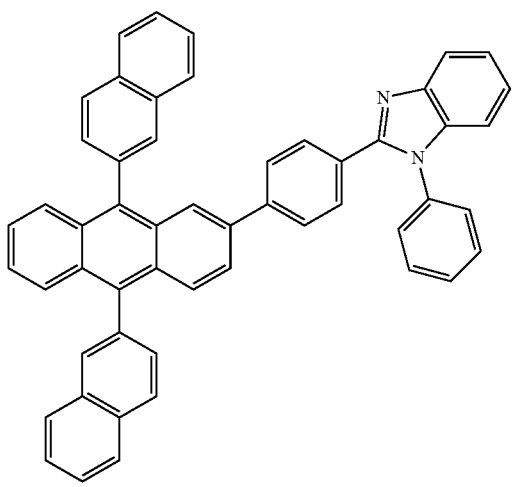

ET2

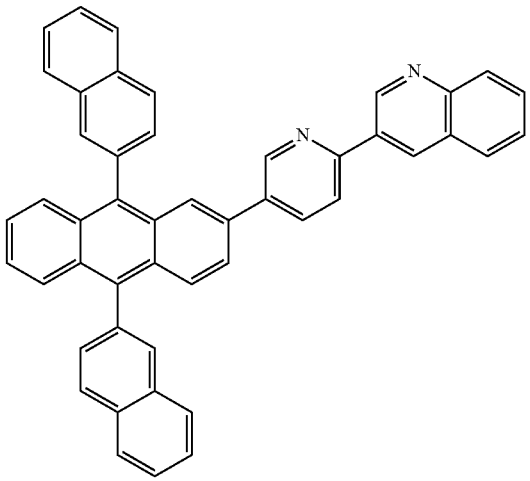

A thickness of the electron transport layer may be in a range of about 100 Å to about 1,000 Å, for example, about 150 Å to about 500 Å. When the thickness of the electron transport layer is within this range, excellent hole blocking characteristics may be obtained without a substantial increase in driving voltage.

Also, the electron transport layer may further include a metal-containing material in addition to the materials described above.

The metal-containing material may include a Li complex. The Li complex may include, for example, Compound ET-D1 (lithium quinolate, LiQ) or ET-D2.

ET-D1

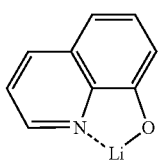

ET-D2

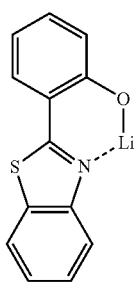

The electron transport region may include an electron injection layer (EIL) that facilitates electron injection from the second electrode 19.

The electron injection layer may include at least one selected from, LiF, NaCl, CsF, $Li_2O$, and BaO.

A thickness of the electron injection layer may be in a range of about 1 Å to about 100 Å, for example, about 3 Å to about 90 Å. When the thickness of the electron injection layer is within this range, excellent hole blocking characteristics may be obtained without a substantial increase in driving voltage.

The second electrode 19 is disposed on the organic layer 15. The second electrode 19 may be a cathode. A material for the second electrode 19 may be a material having a relatively low work function, such as a metal, an alloy, an electrically conductive compound, and a mixture thereof. Detailed examples of the material for forming the second electrode 19 are lithium (Li), magnesium (Mg), aluminum (Al), aluminum-lithium (Al—Li), calcium (Ca), magnesium-indium (Mg—In), and magnesium-silver (Mg—Ag). Alternatively, ITO or IZO may be used to form a transmissive second electrode 19 to manufacture a top emission light-emitting device.

Hereinbefore, the organic light-emitting device has been described with reference to FIG. 1, but is not limited thereto.

A $C_1$-$C_{60}$ alkyl group as used herein refers to a linear or branched aliphatic hydrocarbon monovalent group having 1 to 60 carbon atoms. Detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group). Detailed examples thereof are such as a methoxy group, an ethoxy group, or an isopropyloxy group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are such as a phenyl group, a naphthyl group, an anthracenyl group, a phenanthrenyl group, a pyrenyl group, or a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having a carbocyclic aromatic system having at least one hetero atom selected from N, O, P, and S as a ring-forming atom and 1 to 60 carbon atoms. A $C_1$-$C_{60}$ heteroarylene group as used herein refers to a divalent group having a carbocyclic aromatic system having at least one hetero atom selected from N, O, P, and S as a ring-forming atom and 1 to 60 carbon atoms. Detailed examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

Hereinafter, an organic light-emitting device according to an embodiment will be described in detail with reference to Synthesis Examples and Examples, however, the present embodiment is not limited thereto. The wording "B was used instead of A" used in describing Synthesis Examples means that an amount of B used was identical to an amount of A used based on molar equivalence.

EXAMPLE

Synthesis Example 1

Synthesis of Compound 12

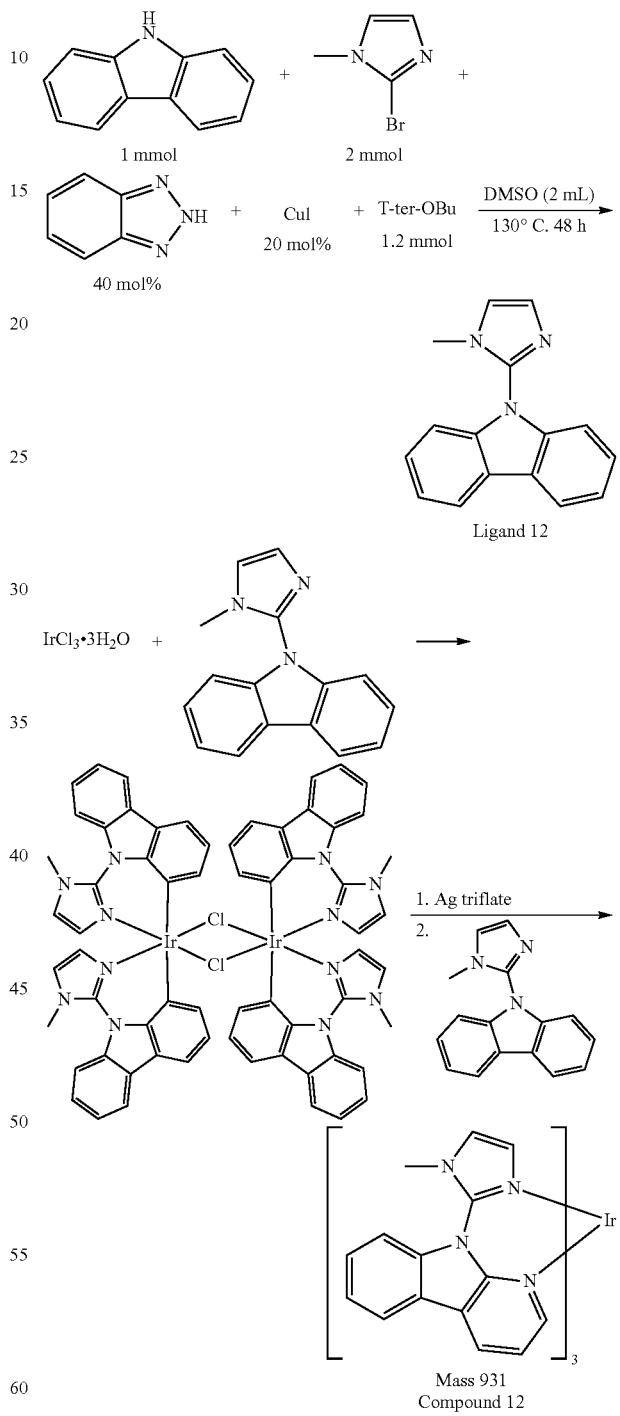

1) Synthesis of Ligand 12

Figure 2:
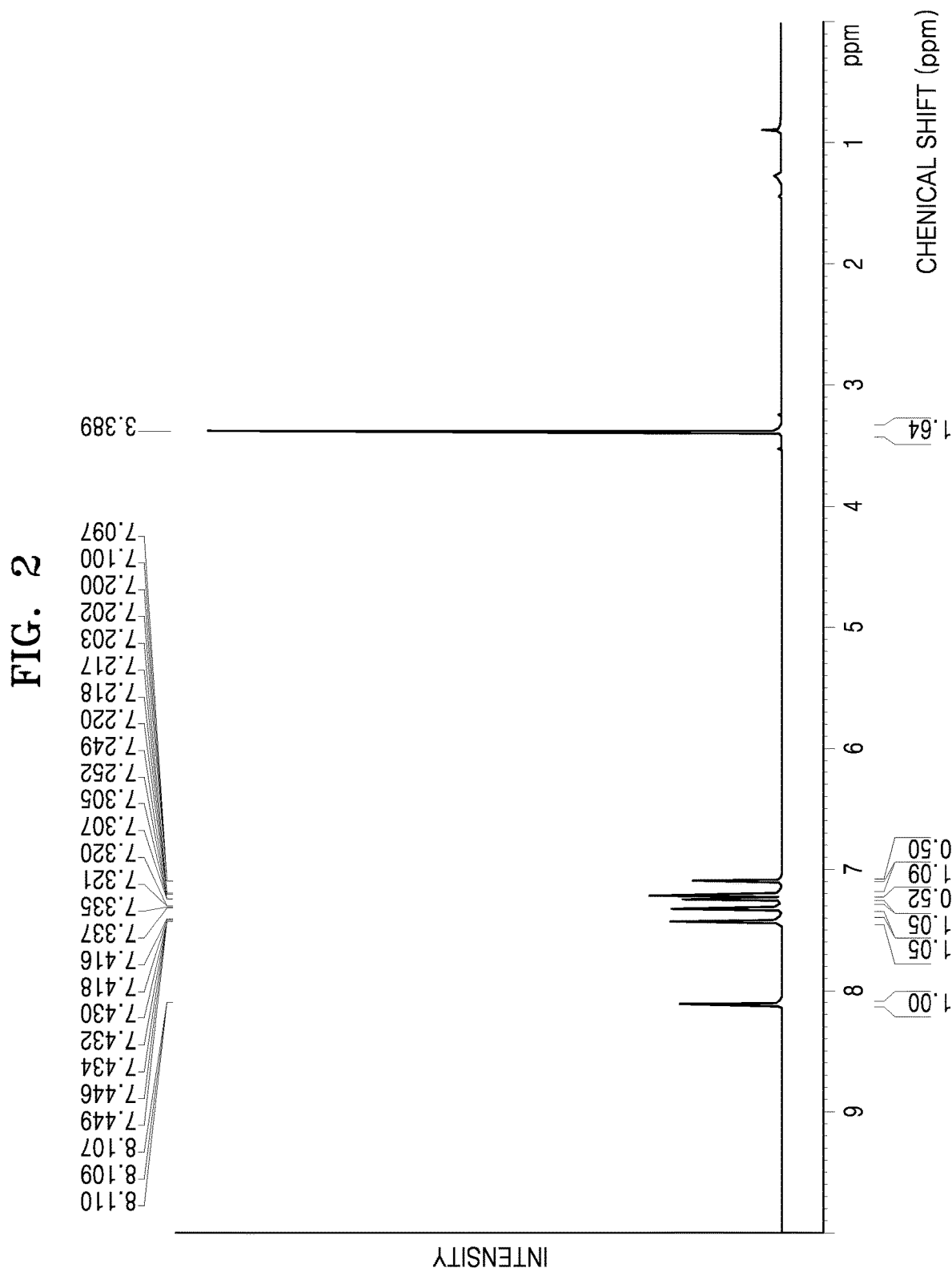
FIG. 2 is a graph of intensity (arbitrary units, a. u.) versus chemical shift (parts per million, ppm) showing a $^1$H NMR spectrum of Ligand 12 according to a Synthesis Example.
Figure 3:
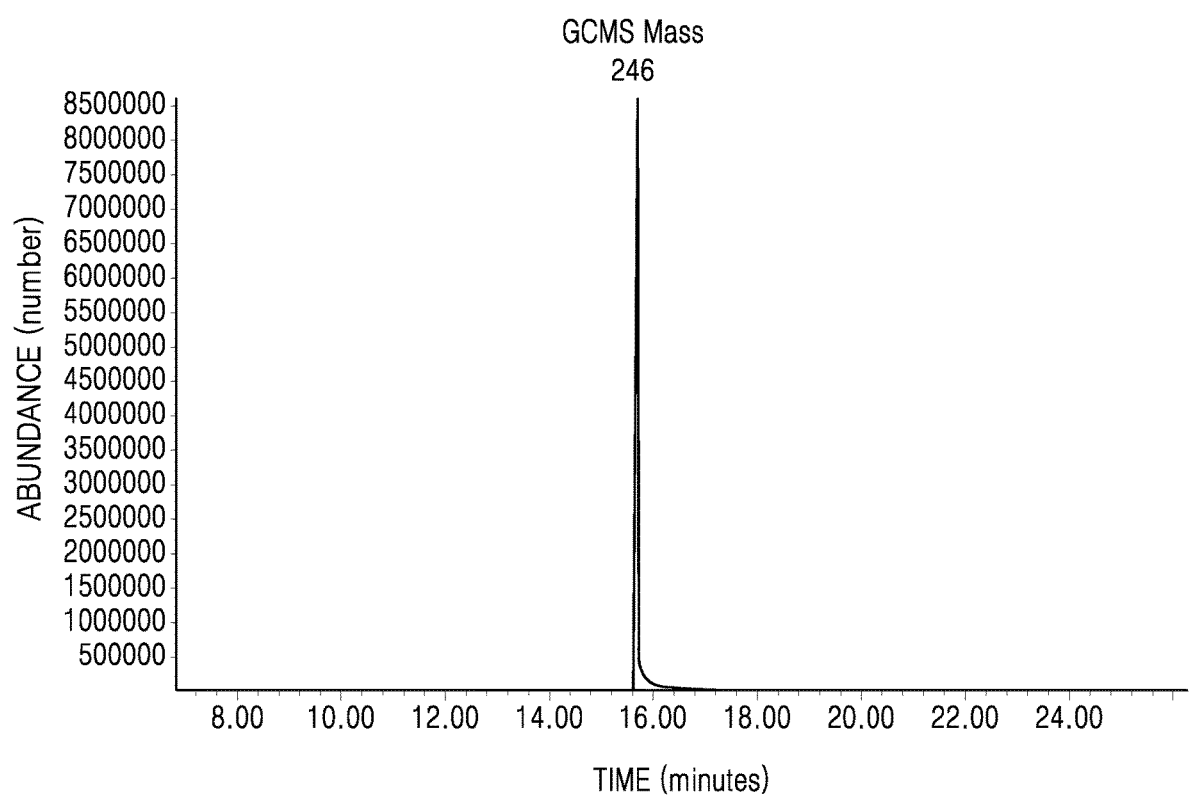
FIG. 3 is a graph of abundance (number) versus time (minutes, min) showing gas chromatography mass spectrometer (GCMS) data of Ligand 12 according to a Synthesis Example.

0.167 grams (g) (1 mmol) of carbazole, 0.322 g (2 mmol) of 2-bromo-N-methylimidazole, 0.046 g (40 mol %) of benzotriazole, 0.038 g (20 mol %) of copper iodide, and 0.157 g (1.4 mmol) of potassium tertiary-butoxide were dissolved in 6 milliliters (mL) of dimethylsulfoxide and stirred at 135° C. for 48 hours. The reaction product was cooled, and water was added thereto. The extraction process was performed by using ethyl acetate. The ethyl acetate extract was dried by using magnesium sulfate, and then distilled under reduced pressure. The obtained brown solid was purified by silica gel chromatography (ethyl acetate and hexane were used as an eluent). As a result, colorless solid Ligand 12 was obtained. Yield of Ligand 12 was 40%. Ligand 12 was identified by $^1$H NMR and GCMS, and the results are shown in FIGS. 2 and 3.

2) Synthesis of Compound 12

Figure 4:
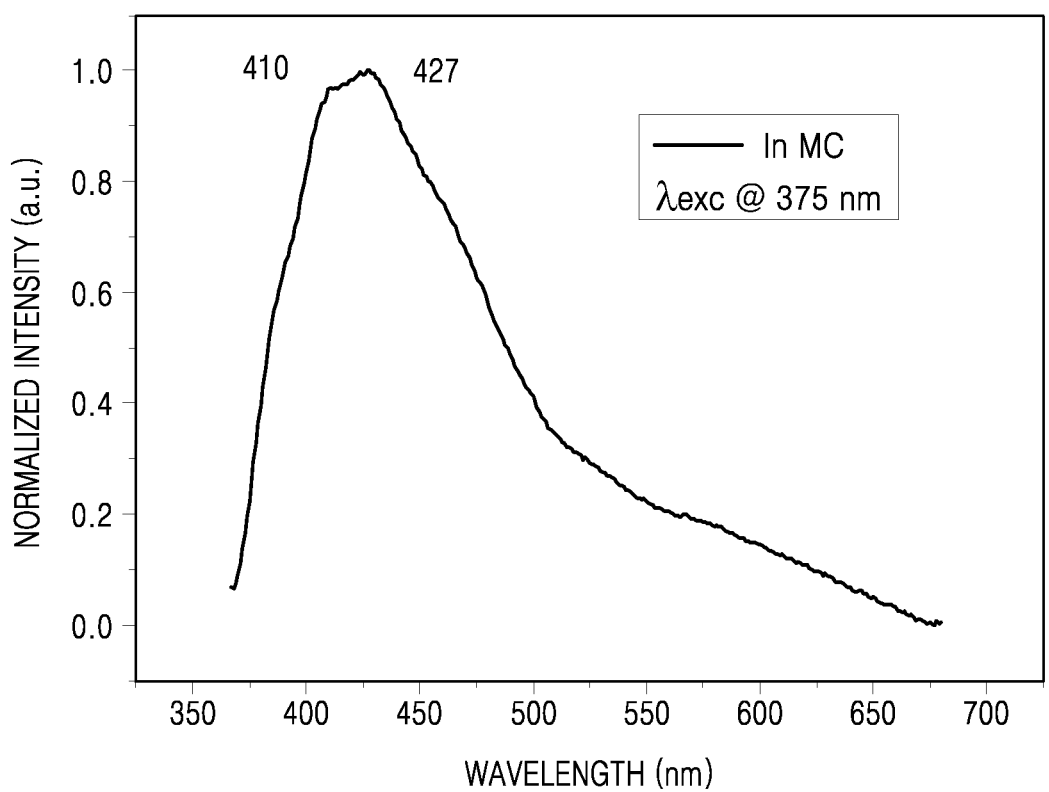
FIG. 4 is a graph of normalized intensity (arbitrary units, a. u.) versus wavelength (nanometers, nm) showing an emission curve of Compound 12 according to a Synthesis Example.

0.352 g (1 mmol) of IrCl$_3$*3H$_2$O and 0.615 g (2.5 mmol) of Ligand 12 were refluxed in 90 mL of 2-ethoxyethanol and 3 mL of water for 24 hours. The reaction product was cooled, water was added thereto, and the reaction product was filtered. The brown residue was washed with water several times, and the residue was dried under a vacuum at 50° C. to obtain a dimer. The dimer was reacted with 4 equivalents of Ligand 12 in the presence of 2.5 equivalents of silver triflate in 2-ethoxyethanol at 150° C. for 6 hours. The solvent was removed by distillation under reduced pressure, and the residue was purified by silica gel chromatography (ethyl acetate and hexane were used as an eluent), to obtain Compound 12. In a mass (MS) spectrum of the obtained Compound 12 measured by matrix-assisted laser desorption/ionization mass spectrometry time-of-flight (MALDI-TOF), a peak was observed at 929 m/z. Compound 12 emitted blue light having a wavelength of 427 nanometers (nm), and the results are shown in FIG. 4.

Synthesis Example 2

Synthesis of Compound 7

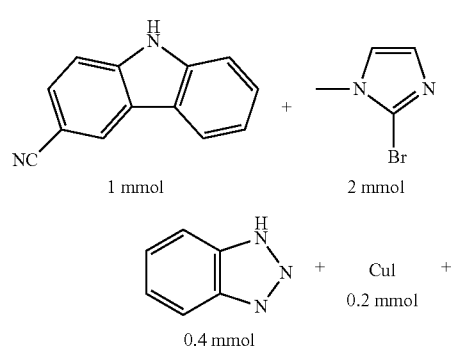

Figure 5:
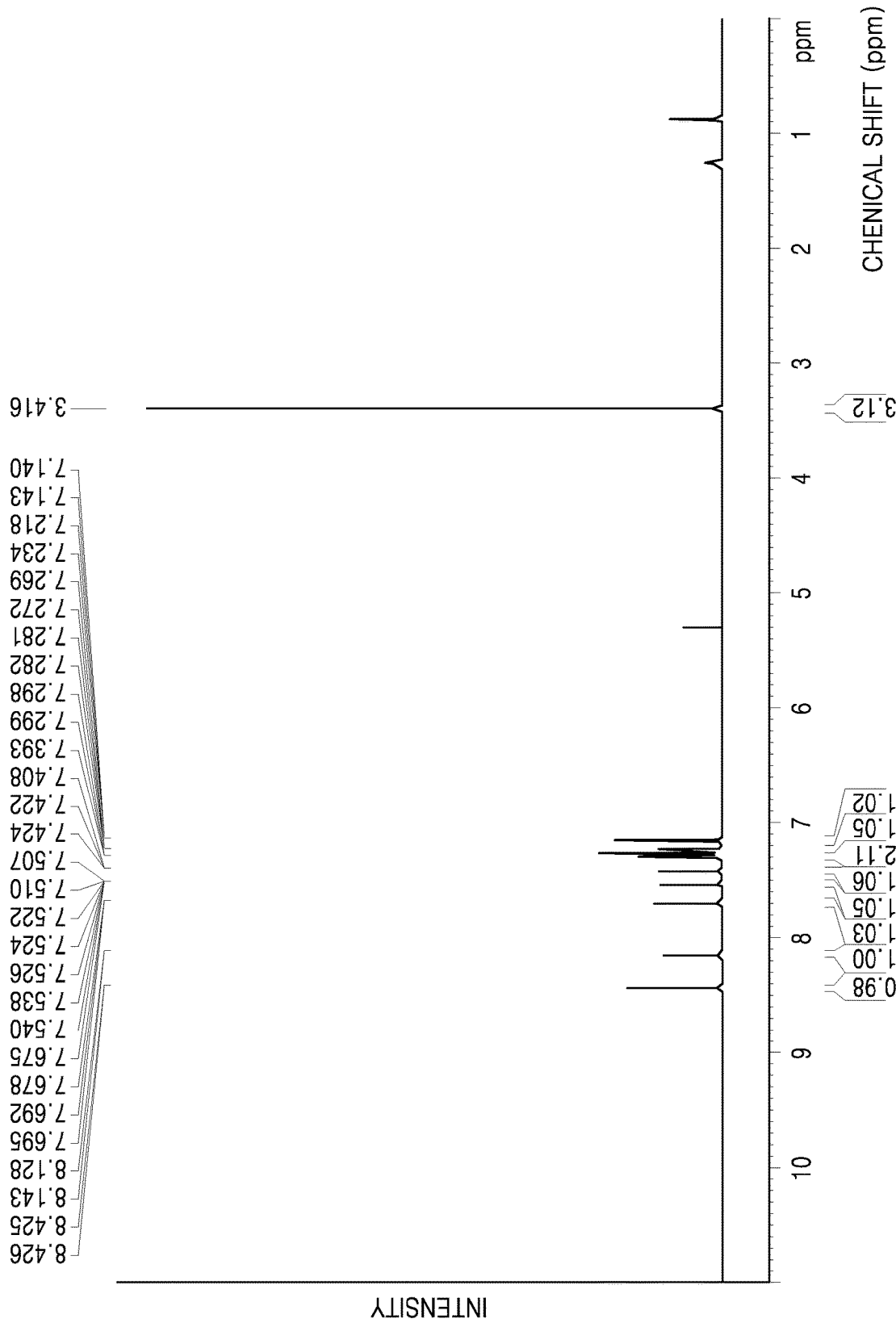
FIG. 5 is a graph of intensity (arbitrary units, a. u.) versus chemical shift (parts per million, ppm) showing a $^1$H NMR spectrum of Ligand 7 according to a Synthesis Example.
Figure 6:
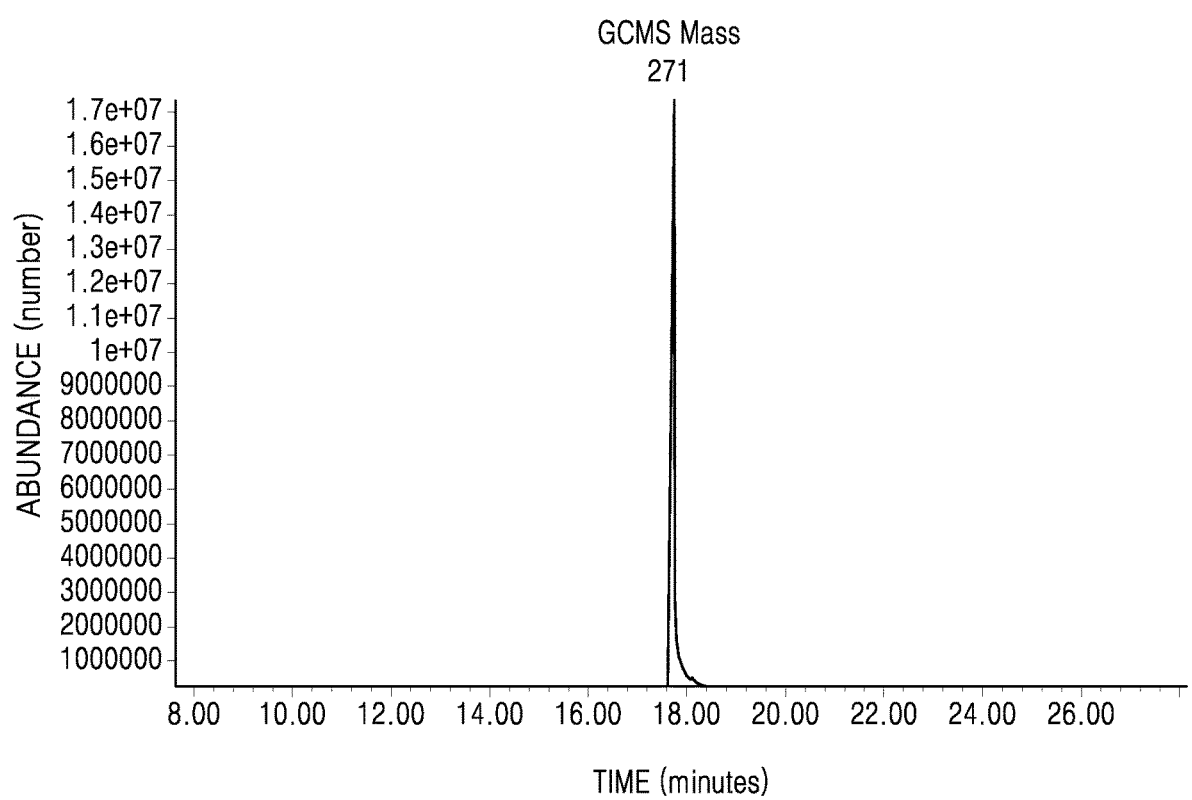
FIG. 6 is a graph of intensity (arbitrary units, a. u.) versus chemical shift (parts per million, ppm) showing GCMS data of Ligand 7 according to a Synthesis Example.

Ligand 7 was synthesized in the same manner as Ligand 12, except that 3-cyano carbazole was used instead of carbazole. Ligand 7 was identified by $^1$H NMR and GCMS, and the results are shown in FIGS. 5 and 6.

2) Synthesis of Compound 7

Compound 7 was synthesized in the same manner as in Synthesis of Compound 12, except that Ligand 7 was used instead of Ligand 12. In a MS spectrum of the obtained Compound 7 measured by using MALDI-TOF, a peak was observed at 1006 m/z.

Synthesis Example 3

Synthesis of Compound 8

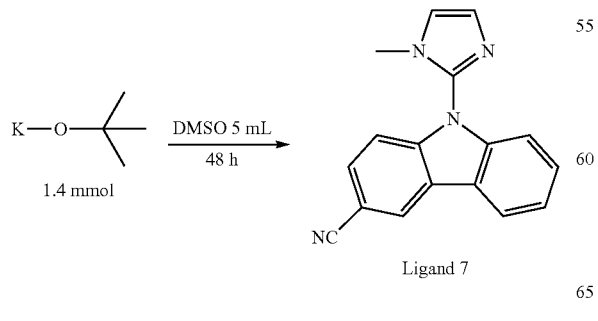

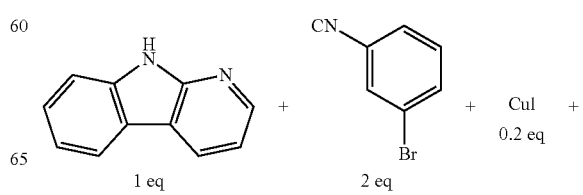

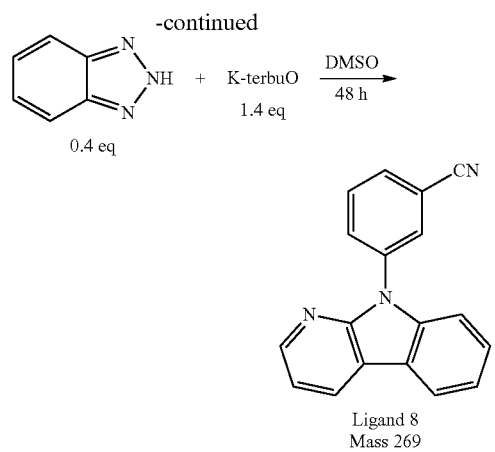
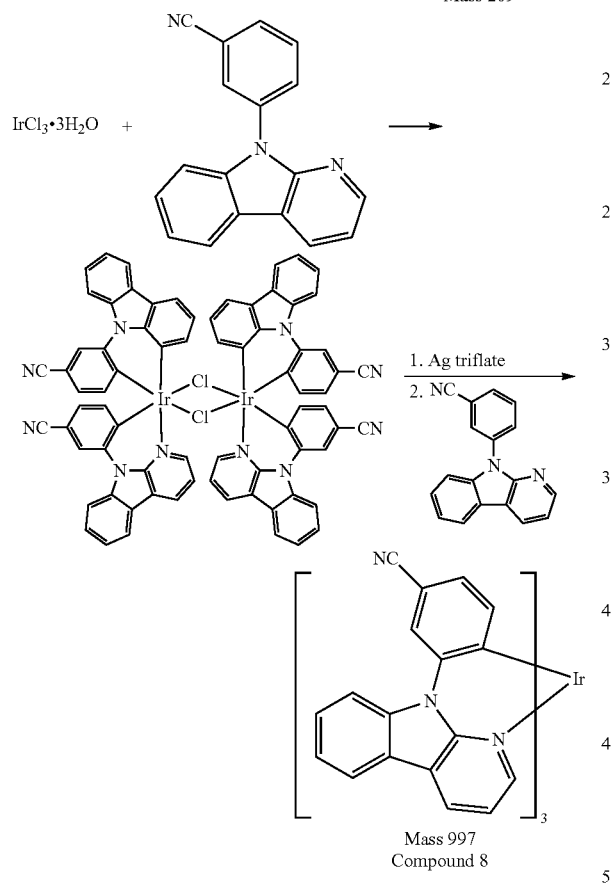
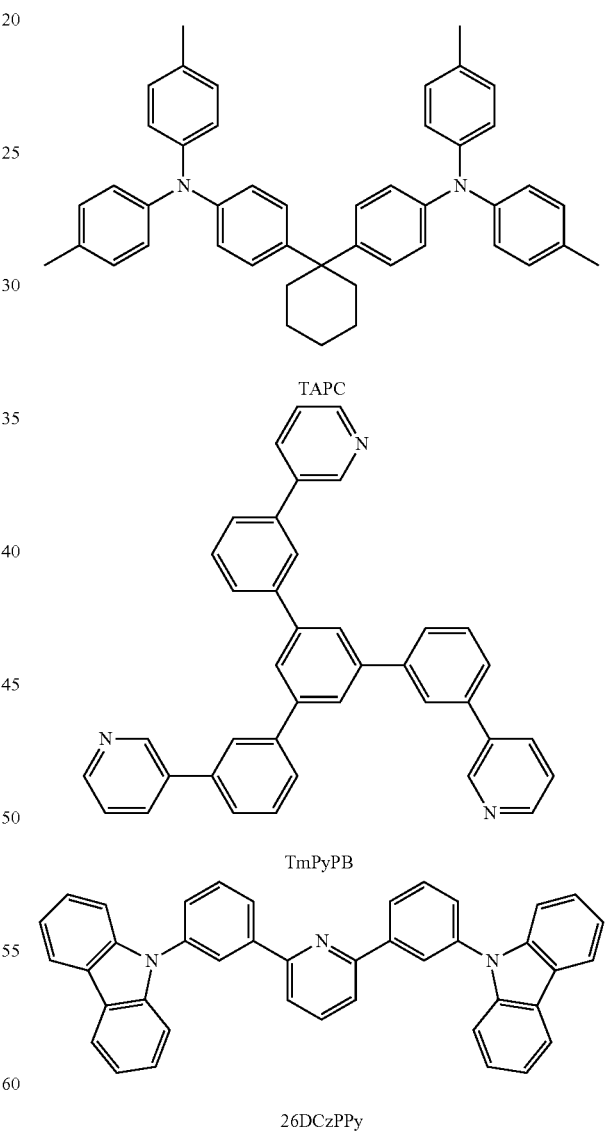

1) Synthesis of Ligand 8

Figure 7:
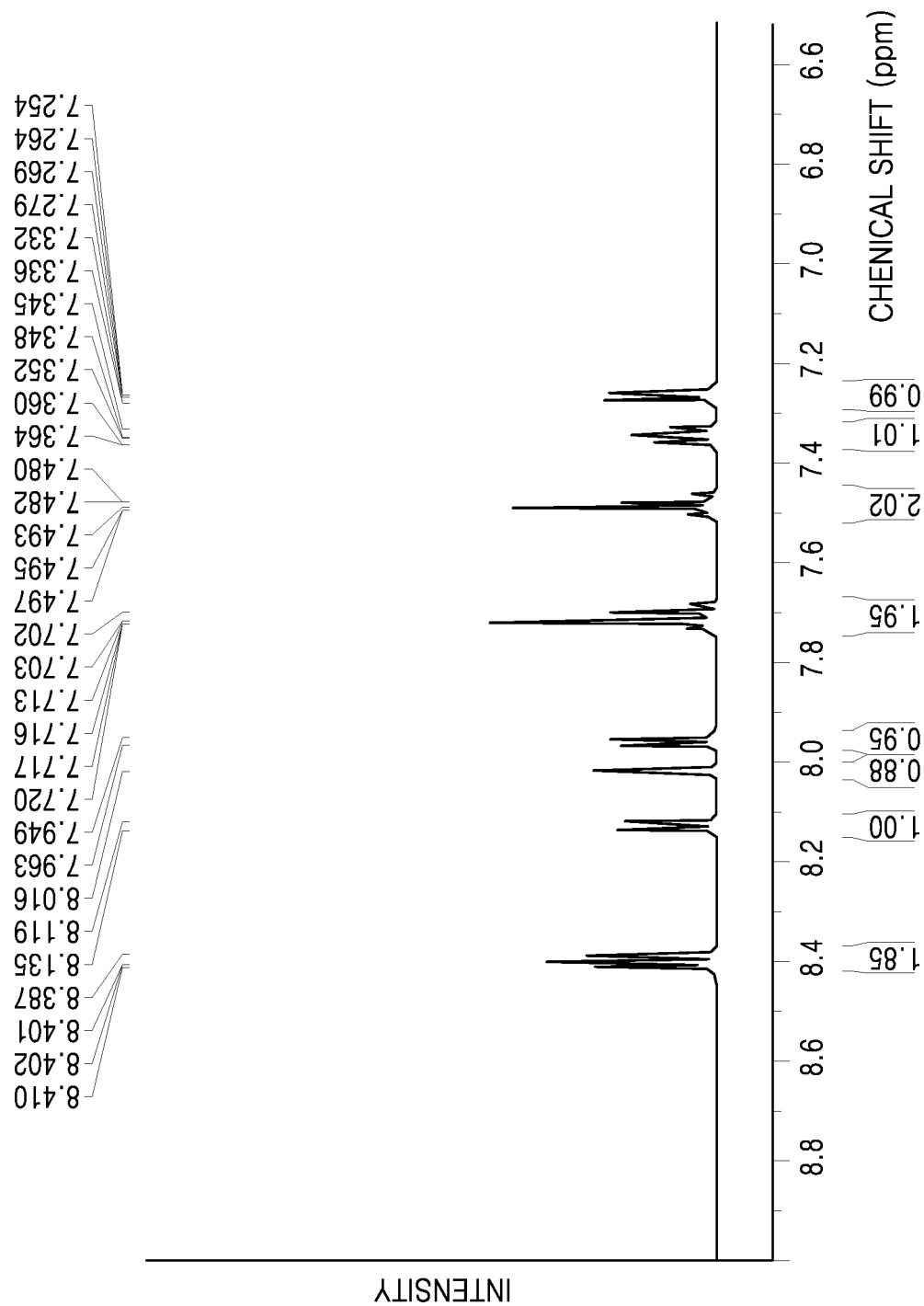
FIG. 7 is a graph of intensity (arbitrary units, a. u.) versus chemical shift (parts per million, ppm) showing a $^1$H NMR spectrum of Ligand 8 according to a Synthesis Example.
Figure 8:
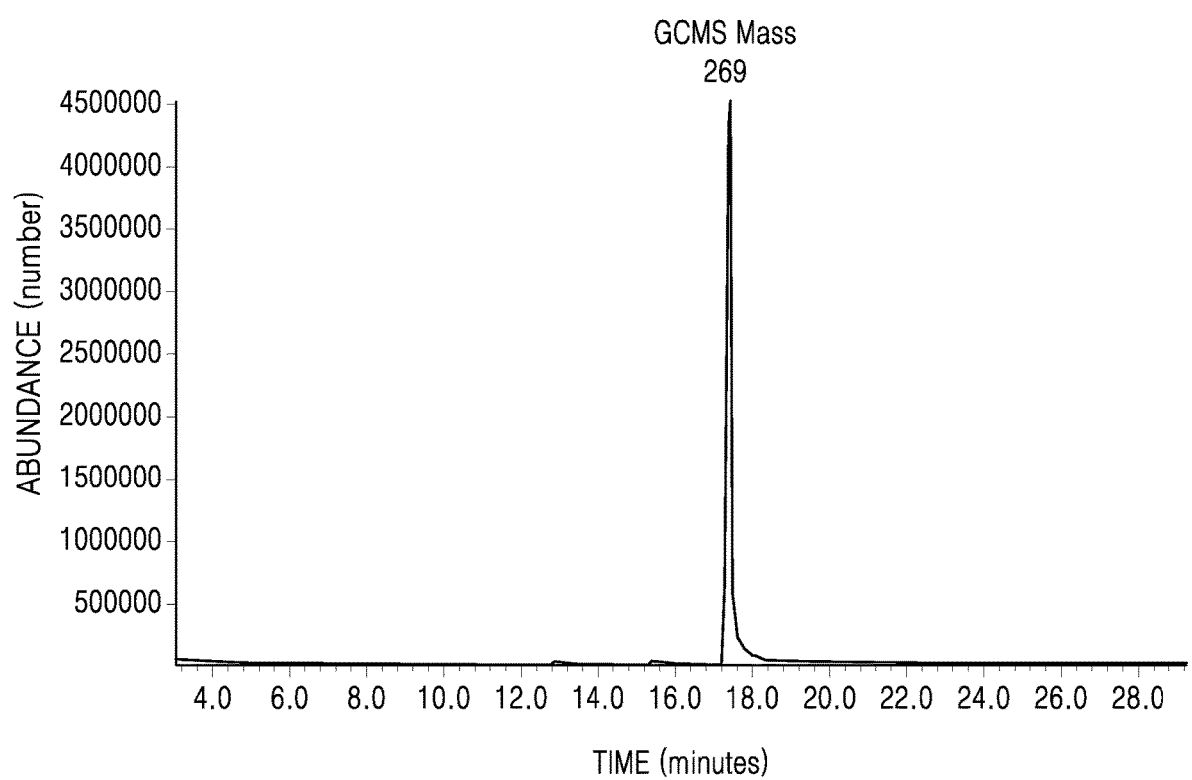
FIG. 8 is a graph of intensity (arbitrary units, a. u.) versus chemical shift (parts per million, ppm) showing GCMS data of Ligand 8 according to a Synthesis Example.

Ligand 8 was synthesized in the same manner as Ligand 12, except that α-carboline was used instead of carbazole, and 3-bromobenzonitrile was used instead of 2-bromo-N-methylimidazole. Ligand 12 was identified by $^1$H NMR and GCMS, and the results are shown in FIGS. 7 and 8.

2) Synthesis of Compound 8

Compound 8 was synthesized in the same manner as Compound 12, except that Ligand 8 was used instead of Ligand 12. In a MS spectrum of the obtained Compound 8 measured by using MALDI-TOF, a peak was observed at 997 m/z. Compound 8 was observed to have an emission peak at 464 nm.

Device Fabrication and Device Characteristic Evaluation

A transparent electrode substrate coated with ITO (indium-tin oxide) is cleaned, and the ITO is patterned with a photosensitive resin and an etchant to form an ITO pattern. Then, the ITO-patterned transparent electrode substrate is cleaned again. The ITO glass substrate is sonicated in isopropyl alcohol (IPA), cleaned, and rinsed with deionized water. The rinsed ITO glass substrate is treated with UV-ozone before it is used to fabricate an ITO coated glass substrate device.

The HTL, EML, and ETL are thermally deposited under vacuum of $10^{-7}$ torr. Then, a LiF electrode and an aluminum cathode are formed under vacuum. As for each layer of a phosphorescence device, the electron-transporting material is 1,3,5-tri[(3-pyridyl)-phen-3-yl]benzene (TmPyPB), the hole-transporting material is 1,1-bis{4-[N,N'-di(p-tolyl) amino]phenyl]cyclohexane (TAPC), and a host material for an emission layer is 2,6-bis[3-(9H-carbazole-9-yl)phenyl) pyridine (26DCzPPy). The emission layer is a phosphorescent emission layer formed by doping the compound 8 at a concentration of 6%.

The characteristics of the devices are evaluated. The evaluation is performed by the following method.

The density-voltage (J-V) current and luminance-voltage (L-V) characteristic of the devices are measured using a Keithley 2635A meter and a Minolta CS-100A luminance meter. In addition, the EL (electroluminescence) spectrum and CIE color coordinator of the devices are measured using a Minolta CS-1000A meter.

The EL devices have the following characteristics.

TABLE 2

| | EL λmax (nm) | CIE (x, y) at 10 mA | Maximum efficiency ηL (cd/A) | Driving voltage (V) |
|---|---|---|---|---|
| Compound 8 | 467 | 0.17, 0.29 | 22.5 | 4.1 |

Referring to Table 2, an electroluminescence device using a compound according to the embodiment has high luminance and high efficiency, and may be operated at a low voltage.

As described above, according to the one or more of the above embodiments, the organometallic compound according to embodiments has excellent electric characteristics and thermal stability. Accordingly, an organic light-emitting device including the organometallic compound may have a low driving voltage, high efficiency, high brightness, long lifespan, and high color purity characteristics.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present inventive concept as defined by the following claims.

What is claimed is:

1. An organometallic compound represented by Formula 1:

Formula 1

Ir(L$_1$)$_n$(L$_2$)$_{(3-n)}$

Formula 2

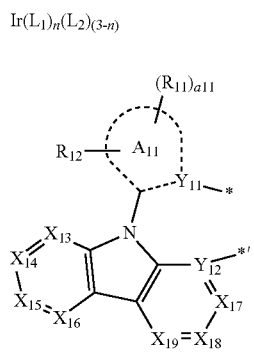

-continued

Formula 3

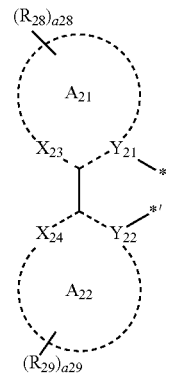

wherein in Formulae 1 to 3,

L$_1$ is a first ligand represented by Formula 2;

L$_2$ is a second ligand represented by Formula 3, wherein L$_2$ includes at least one cyano group as a substituent;

n is selected from 2 and 3;

A$_{11}$ is selected from a C$_6$-C$_{60}$ cyclic group and a C$_1$-C$_{60}$ heterocyclic group selected from an imidazole, a pyrazole, an isothiazole, an isoxazole, a pyrazine, a pyridazine, a quinoline, an isoquinoline, a benzoquinoline, a quinoxaline, a quinazoline, a benzoimidazole, a benzoxazole, an isobenzoxazole, a triazole, a tetrazole, an oxadiazole, a triazine, a pyridoindole, a pyridofuran, and a pyridothiophene, each comprising Y$_{11}$ as a cyclic ring member;

A$_{21}$, and A$_{22}$ are each independently selected from a naphthalene, an anthracene, a phenanthrene, a pyrrole, an imidazole, a pyrazole, a thiazole, an isothiazole, an oxazole, an isoxazole, a pyridine, a pyrazine, a pyrimidine, a pyridazine, a quinoline, an isoquinoline, a benzoquinoline, a quinoxaline, a quinazoline, a benzoimidazole, a benzoxazole, an isobenzoxazole, a triazole, a tetrazole, an oxadiazole, a triazine, a pyridoindole, a pyridofuran, and a pyridothiophene;

Y$_{11}$, Y$_{12}$, Y$_{21}$, and Y$_{22}$ are each independently selected from C and N;

X$_{13}$ is N or CR$_{13}$;

X$_{14}$ is N or CR$_{14}$;

X$_{15}$ is N or CR$_{15}$;

X$_{16}$ is N or CR$_{16}$;

X$_{17}$ is N or CR$_{17}$;

X$_{18}$ is N or CR$_{18}$;

X$_{19}$ is N or CR$_{19}$;

X$_{23}$ is N or CR$_{23}$; and

X$_{24}$ is N or CR$_{24}$;

provided that when A$_{11}$ is an imidazole, X$_{13}$ is CR$_{13}$, X$_{14}$ is CR$_{14}$, X$_{15}$ is CR$_{15}$, X$_{16}$ is CR$_{16}$, X$_{17}$ is CR$_{17}$, X$_{18}$ is CR$_{18}$, and X$_{19}$ is CR$_{19}$, then n in Formula 1 is 2, and the second ligand is represented by Formula 3A:

Formula 3A wherein in Formula 3A, $Y_{21}$ and $Y_{22}$ are each independently selected from C and N;

$X_{21}$ is N or $CR_{21}$, $X_{23}$ is N or $CR_{23}$, and $X_{25}$ is N or $CR_{25}$;

provided that when $Y_{22}$ is C, then $X_{25}$ is N;

provided that when $X_{25}$ is C, then $Y_{22}$ is N;

$R_{21}$ to $R_{27}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group, wherein at least one of $R_{21}$ to $R_{27}$ is a cyano group;

* and *' are each independently a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ are each independently selected from a $C_1$-$C_{60}$ alkyl group and a $C_6$-$C_{60}$ aryl group;

wherein in Formula 2 and 3, $R_{11}$ to $R_{19}$, $R_{23}$, $R_{24}$, $R_{28}$, and $R_{29}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11, a28, and a29 are each independently selected from 1, 2, 3, 4, 5, and 6;

$R_{12}$ and $R_{13}$ are optionally linked to each other via a divalent linking group selected from a single bond, *—O—*', *—S—*', *—N($Z_{11}$)—*', and *—[C($Z_{11}$)($Z_{12}$)]$_{b11}$—*'; wherein $Z_{11}$ and $Z_{12}$ are each independently selected from a hydrogen, a deuterium, —F, —Cl, —Br, —I, a substituted or unsubstituted $C_1$-$C_{60}$ alkyl group, and a substituted or unsubstituted $C_6$-$C_{60}$ aryl group;

b11 is selected from 1, 2, 3, and 4;

* and *' are each independently a binding site to a neighboring atom;

a11 is selected from 1, 2, and 3;

* and *' indicates a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ are each independently selected from a $C_1$-$C_{60}$ alkyl group and $C_6$-$C_{60}$ aryl group.

2. The organometallic compound of claim 1, wherein $L_1$ comprises at least one cyano group as a substituent.

3. The organometallic compound of claim 1, wherein $A_{11}$ is selected from a benzene, a naphthalene, an anthracene, and a phenanthrene.

4. The organometallic compound of claim 1, wherein $A_{11}$ is each independently selected from a benzene and a naphthalene.

5. The organometallic compound of claim 1, wherein $A_{21}$ and $A_{22}$ are each independently selected from a naphthalene, a pyrrole, an imidazole, a pyrazole, a pyridine, a pyrazine, a pyrimidine, a pyridazine, a quinoline, an isoquinoline, a quinoxaline, a quinazoline, a triazole, and a tetrazole.

6. The organometallic compound of claim 1, wherein $Y_{11}$ and $Y_{12}$ are different from each other, and $Y_{21}$ and $Y_{22}$ are different from each other.

7. The organometallic compound of claim 1, wherein $R_{11}$ to $R_{19}$, $R_{23}$, $R_{24}$, $R_{28}$, and $R_{29}$ are each independently a hydrogen, a deuterium, —F, —Cl, —Br, —I, a cyano group, a $C_1$-$C_{60}$ alkyl group, a $C_1$-$C_{60}$ alkoxy group, a $C_6$-$C_{60}$ aryl group, and a $C_1$-$C_{60}$ heteroaryl group;

a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a deuterium, —F, —Cl, —Br, —I, a methyl group, an ethyl group, a n-propyl group, an iso-propyl group, a n-butyl group, an iso-butyl group, a sec-butyl group, a tert-butyl group, a methoxy group, an ethoxy group, a tert-butoxy group, a phenyl group, a naphthyl group, a pyridinyl group, a pyrimidinyl group, and —Si($Q_{31}$)($Q_{32}$)($Q_{33}$); and a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a phenyl group, a naphthyl group, a pyridinyl group, and a pyrimidinyl group, each substituted with at least one selected from a deuterium, —F, —Cl, —Br, —I, a methyl group, an ethyl group, a phenyl group, a naphthyl group, a pyridinyl group, and a pyrimidinyl group;

wherein $Q_{31}$ to $Q_{33}$ are each independently selected from a methyl group, an ethyl group, an iso-propyl group, a tert-butyl group, a phenyl group, and a naphthyl group.

8. The organometallic compound of claim 1, wherein $R_{11}$ to $R_{19}$, $R_{23}$, $R_{24}$, $R_{28}$, and $R_{29}$ are each independently selected from a hydrogen, a deuterium, —F, —Cl, —Br, —I, a cyano group, a methyl group, an ethyl group, a n-propyl group, an iso-propyl group, a n-butyl group, an iso-butyl group, a sec-butyl group, a tert-butyl group, a phenyl group, a naphthyl group, a pyridinyl group, and a pyrimidinyl group;

a phenyl group and a naphthyl group, each substituted with at least one selected from a deuterium, —F, a methyl group, an ethyl group, an iso-propyl group, a tert-butyl group, and —Si($Q_{31}$)($Q_{32}$)($Q_{33}$); and a phenyl group and a naphthyl group, each substituted with at least one selected from a phenyl group and a naphthyl group, each substituted with at least one selected from a deuterium, —F, —Cl, —Br, —I, a methyl group, an ethyl group, a phenyl group, a naphthyl group, a pyridinyl group, and a pyrimidinyl group;

wherein $Q_{31}$ to $Q_{33}$ are each independently selected from a methyl group and a phenyl group.

9. The organometallic compound of claim 1, wherein $R_{11}$ to $R_{19}$, $R_{23}$, $R_{24}$, $R_{28}$, and $R_{29}$ are each independently selected from a hydrogen, a deuterium, —F, —Cl, —Br, —I, a cyano group, and any group selected from Formulae 6-1 to 6-13:

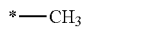

6-1

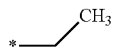

6-2

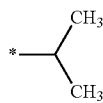

6-3

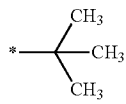

6-4

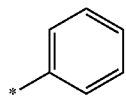

6-5

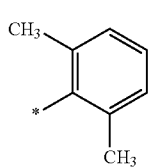

6-6

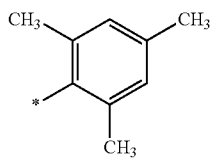

6-6

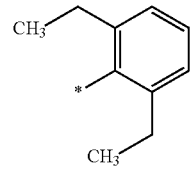

6-8

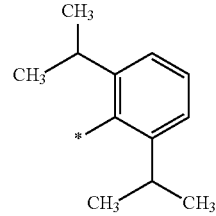

6-9

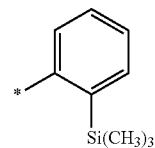

6-10

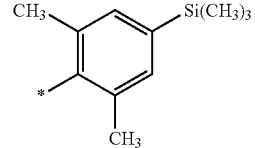

6-11

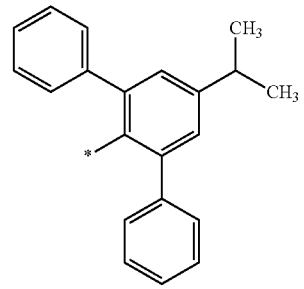

6-12

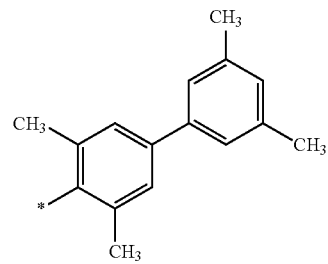

6-13 wherein in Formulae 6-1 to 6-13,

* indicates a binding site to a neighboring atom.

10. The organometallic compound of claim 1, wherein $R_{12}$ and $R_{13}$ are optionally linked to each other via a divalent linking group selected from a single bond,

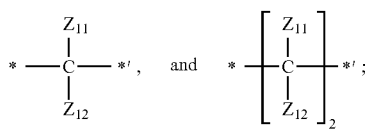

and

Z$_{11}$ and Z$_{12}$ are each independently selected from a hydrogen, a deuterium, —F, a methyl group, and an ethyl group.

11. The organometallic compound of claim 1, wherein the first ligand is represented by Formula 2A:

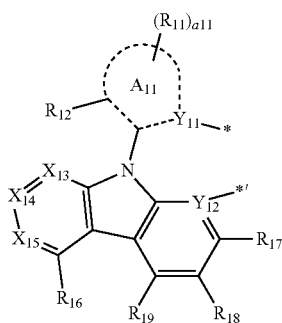

Formula 2A wherein in Formula 2A,

A$_{11}$ is selected from a C$_6$-C$_{60}$ cyclic group and a C$_1$-C$_{60}$ heterocyclic group selected from an imidazole, a pyrazole, an isothiazole, an isoxazole, a pyrazine, a pyridazine, a quinoline, an isoquinoline, a benzoquinoline, a quinoxaline, a quinazoline, a benzoimidazole, a benzoxazole, an isobenzoxazole, a triazole, a tetrazole, an oxadiazole, a triazine, a pyridoindole, a pyridofuran, and a pyridothiophene, each comprising Y$_{11}$ as a cyclic ring member;

Y$_{11}$ and Y$_{12}$ are each independently selected from C and N;

X$_{13}$ is N or CR$_{13}$, X$_{14}$ is N or CR$_{14}$, and X$_{15}$ is N or CR$_{15}$;

R$_{11}$ to R$_{19}$ are each independently selected from a hydrogen, a deuterium, —F, —Cl, —Br, —I, a cyano group, a substituted or unsubstituted C$_1$-C$_{60}$ alkyl group, a substituted or unsubstituted C$_1$-C$_{60}$ alkoxy group, a substituted or unsubstituted C$_6$-C$_{60}$ aryl group, and a substituted or unsubstituted C$_1$-C$_{60}$ heteroaryl group;

a11 is selected from 1, 2, 3, 4, 5, and 6;

R$_{12}$ and R$_{13}$ are optionally linked to each other via a divalent linking group selected from a single bond, *—S—*', *—N(Z$_{11}$)—*', and *—[C(Z$_{11}$)(Z$_{12}$)]$_{b11}$—*'; wherein Z$_{11}$ and Z$_{12}$ are each independently selected from a hydrogen, a deuterium, —F, —Cl, —Br, —I, and a substituted or unsubstituted C$_1$-C$_{60}$ alkyl group;

b11 is selected from 1, 2, 3, and 4;

* and *' are each independently a binding site to a neighboring atom;

at least one substituent of the substituted C$_1$-C$_{60}$ alkyl group, substituted C$_1$-C$_{60}$ alkoxy group, substituted C$_6$-C$_{60}$ aryl group, and substituted C$_1$-C$_{60}$ heteroaryl group are selected from a deuterium, —F, —Cl, —Br, —I, a C$_1$-C$_{60}$ alkyl group, and a C$_1$-C$_{60}$ alkoxy group;

a C$_1$-C$_{60}$ alkyl group and a C$_1$-C$_{60}$ alkoxy group, each substituted with at least one selected from a deuterium, —F, —Cl, —Br, —I, a C$_1$-C$_{60}$ alkyl group, a C$_1$-C$_{60}$ alkoxy group, and —Si(Q$_{11}$)(Q$_{12}$)(Q$_{13}$);

a C$_6$-C$_{60}$ aryl group, a C$_6$-C$_{60}$ aryloxy group, a C$_6$-C$_{60}$ arylthio group, and a C$_1$-C$_{60}$ heteroaryl group;

a C$_6$-C$_{60}$ aryl group, a C$_6$-C$_{60}$ aryloxy group, a C$_6$-C$_{60}$ arylthio group, and a C$_1$-C$_{60}$ heteroaryl group, each substituted with at least one selected from a deuterium, —F, —Cl, —Br, —I, a C$_1$-C$_{60}$ alkyl group, a C$_1$-C$_{60}$ alkoxy group, a C$_6$-C$_{60}$ aryl group, a C$_6$-C$_{60}$ aryloxy group, a C$_6$-C$_{60}$ arylthio group, a C$_1$-C$_{60}$ heteroaryl group, and —Si(Q$_{21}$)(Q$_{22}$)(Q$_{23}$); and —Si(Q$_{31}$)(Q$_{32}$)(Q$_{33}$);

wherein Q$_{11}$ to Q$_{13}$, Q$_{21}$ to Q$_{23}$, and Q$_{31}$ to Q$_{33}$ are each independently selected from a C$_1$-C$_{60}$ alkyl group and C$_6$-C$_{60}$ aryl group.

12. The organometallic compound as claimed in claim 11, wherein

X$_{15}$ is CR$_{15}$; and at least one group selected from R$_{11}$ and R$_{15}$ is a cyano group.

13. The organometallic compound as claimed in claim 1, wherein the first ligand is represented by any group selected from Formulae 2-1 to 2-10:

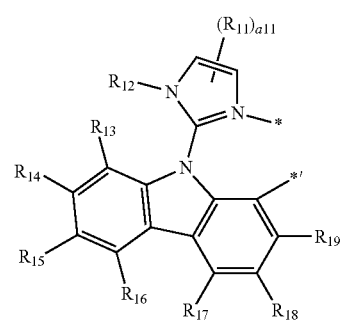

Formula 2-1

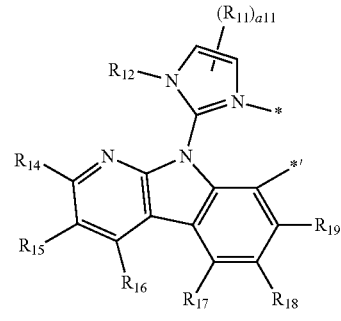

Formula 2-2

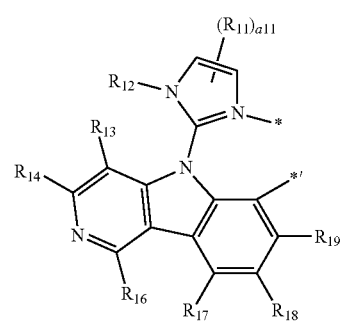

Formula 2-3

-continued

Formula 2-4
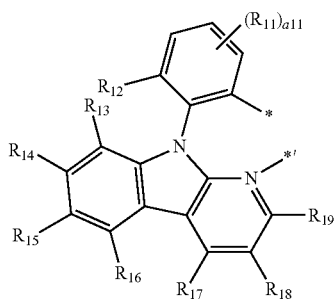

Formula 2-5
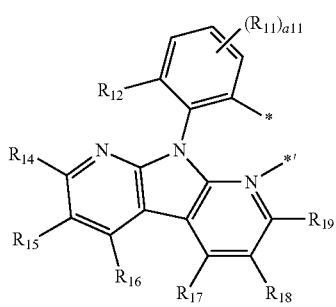

Formula 2-6
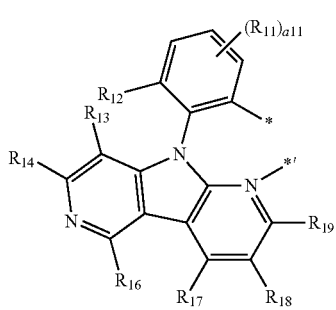

Formula 2-7
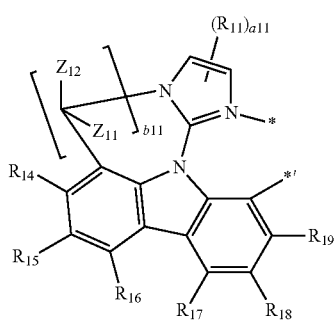

Formula 2-8
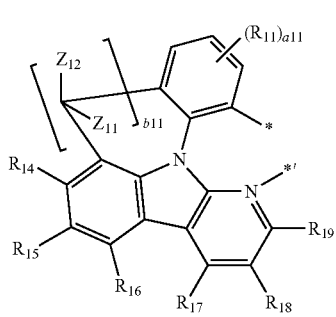

-continued

Formula 2-9
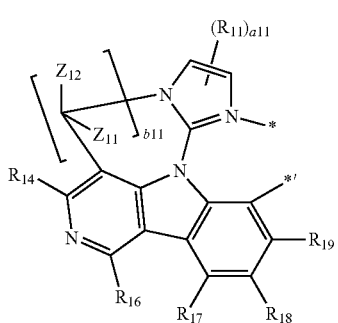

Formula 2-10
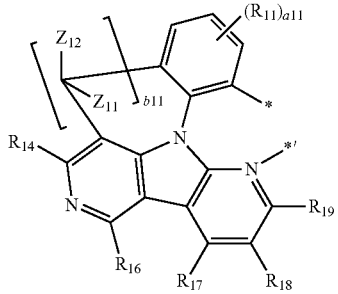

wherein in Formulae 2-1 to 2-10, $R_{11}$ to $R_{19}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11 is selected from 1, 2, 3, 4, 5, and 6;

$Z_{11}$ and $Z_{12}$ are each independently selected from a hydrogen, a deuterium, —F, —Cl, —Br, —I, and a substituted or unsubstituted $C_1$-$C_{60}$ alkyl group;

b11 is selected from 1, 2, 3, and 4;

* and *' are each independently a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group are selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ are each independently selected from a $C_1$-$C_{60}$ alkyl group and $C_6$-$C_{60}$ aryl group.

14. The organometallic compound as claimed in claim 1, wherein the second ligand is represented by Formula 3A:

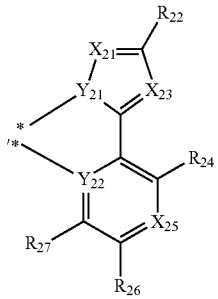

Formula 3A wherein in Formula 3A, $Y_{21}$ and $Y_{22}$ are each independently selected from C and N;

$X_{21}$ is N or $CR_{21}$, $X_{23}$ is N or $CR_{23}$, and $X_{25}$ is N or $CR_{25}$;

provided that when $Y_{22}$ is C, then $X_{25}$ is N;

provided that when $X_{25}$ is C, then $Y_{22}$ is N;

$R_{21}$ to $R_{27}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group, wherein at least one of $R_{21}$ to $R_{27}$ is a cyano group;

* and *' are each independently a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ are each independently selected from a $C_1$-$C_{60}$ alkyl group and a $C_6$-$C_{60}$ aryl group.

15. The organometallic compound as claimed in claim 1, wherein the second ligand is represented by Formula 3-1:

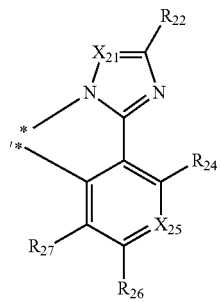

Formula 3-1 wherein in Formula 3-1;

$X_{21}$ is N or $CR_{21}$;

$X_{25}$ is N or $CR_{25}$, $R_{21}$, $R_{22}$, and $R_{24}$ to $R_{27}$ are each independently selected from a hydrogen, a deuterium, —F, —Cl, —Br, —I, a cyano group, a $C_1$-$C_{60}$ alkyl group, a $C_1$-$C_{60}$ alkoxy group, a $C_6$-$C_{60}$ aryl group, and a $C_1$-$C_{60}$ heteroaryl group, wherein at least one of $R_{21}$, $R_{22}$, and $R_{24}$ to $R_{27}$ is a cyano group;

a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a deuterium, —F, —Cl, —Br, —I, a methyl group, an ethyl group, a n-propyl group, an iso-propyl group, a n-butyl group, an iso-butyl group, a sec-butyl group, a tert-butyl group, a methoxy group, an ethoxy group, a tert-butoxy group, a phenyl group, a naphthyl group, a pyridinyl group, a pyrimidinyl group, and —Si($Q_{31}$)($Q_{32}$)($Q_{33}$); and a $C_1$-$C_{60}$ alkyl group, a $C_1$-$C_{60}$ alkoxy group, a $C_6$-$C_{60}$ aryl group, and a $C_1$-$C_{60}$ heteroaryl group, each substituted with at least one selected from a phenyl group, a naphthyl group, a pyridinyl group, and a pyrimidinyl group, each substituted with at least one selected from a deuterium, —F, —Cl, —Br, —I, a methyl group, an ethyl group, a phenyl group, a naphthyl group, a pyridinyl group, and a pyrimidinyl group;

a11 is selected from 1, 2, and 3;

* and *' indicates a binding site to a neighboring atom.

16. An organic light-emitting device comprising:

a first electrode;

a second electrode; and an organic layer disposed between the first electrode and the second electrode, wherein the organic layer comprises an emission layer and at least one organometallic compounds of claim 1.

17. The organic light-emitting device of claim 16, wherein the emission layer comprises the organometallic compound of claim 1.

18. The organometallic compound of claim 1, wherein $Y_{12}$ is carbon.

19. An organometallic compound represented by any group selected from Formulae 1-2 to 1-4 and 1-6 to 1-8:

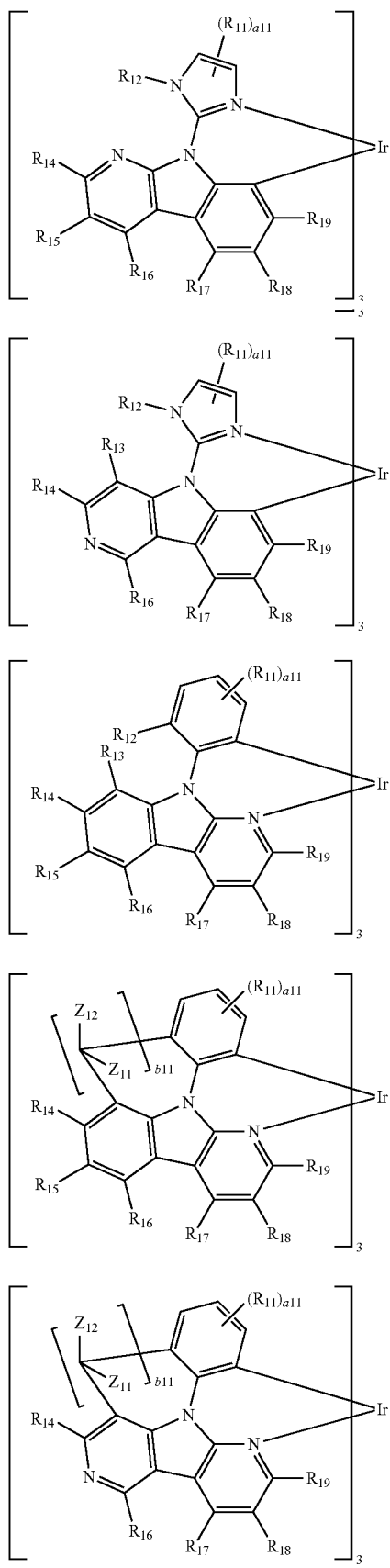

Formula 1-3

Formula 1-4

Formula 1-6

Formula 1-7

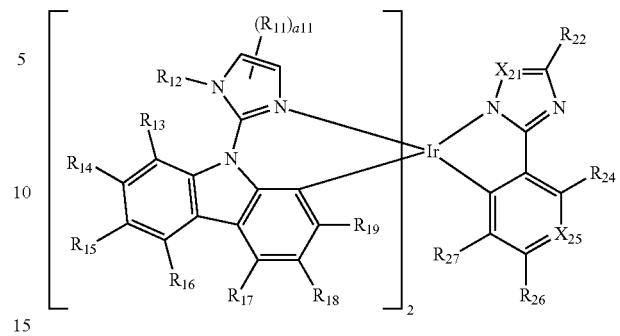

Formula 1-8 wherein in Formulae 1-2 to 1-4 and 1-6 to 1-8;

$X_{21}$ is N or $CR_{21}$; and $X_{25}$ is N;

$R_{11}$ to $R_{19}$, $R_{21}$, $R_{22}$, $R_{24}$, and $R_{27}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group, wherein at least one of $R_{21}$, $R_{22}$, $R_{24}$, and $R_{27}$ is a cyano group;

a11 is selected from 1, 2, and 3;

$Z_{11}$ and $Z_{12}$ are each independently selected from a hydrogen, a deuterium, —F, a methyl group, and an ethyl group;

b11 is selected from 1 and 2;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$);

wherein $Q_{11}$ to $Q_{13}$, $Q_{21}$ to $Q_{23}$, and $Q_{31}$ to $Q_{33}$ are each independently selected from a $C_1$-$C_{60}$ alkyl group and a $C_6$-$C_{60}$ aryl group.

20. An organometallic compound selected from Compounds 3 to 6, 8 to 11, 13, and 14:

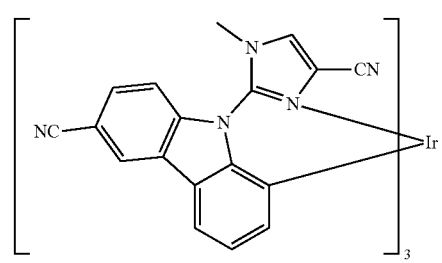

3

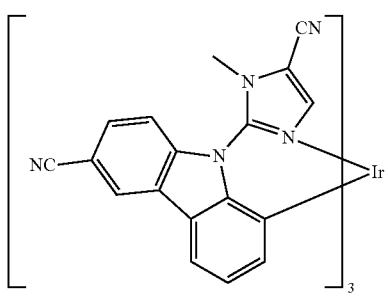
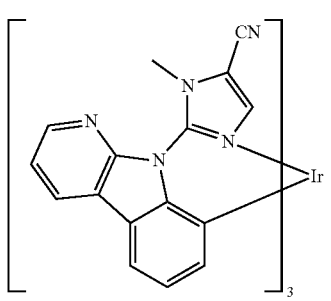
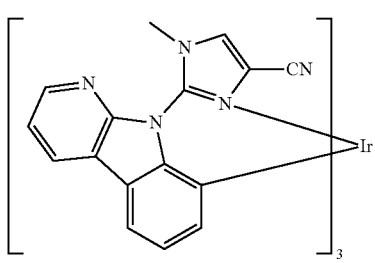
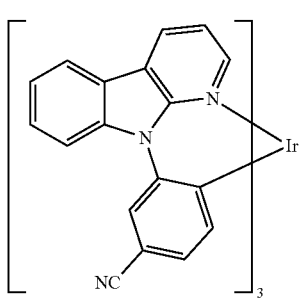
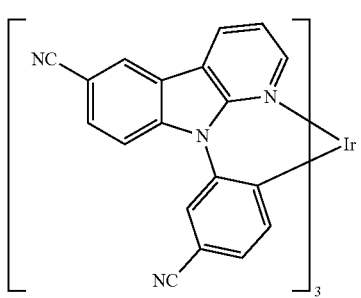
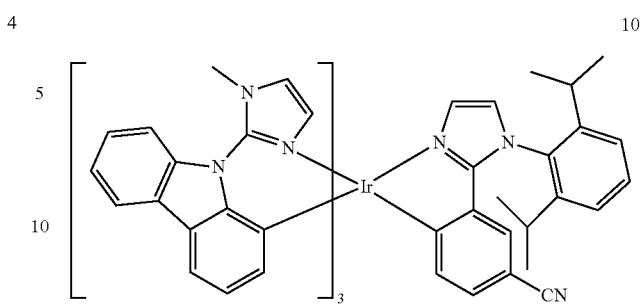
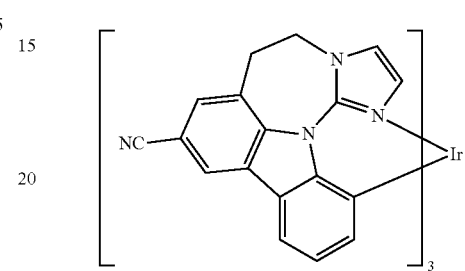
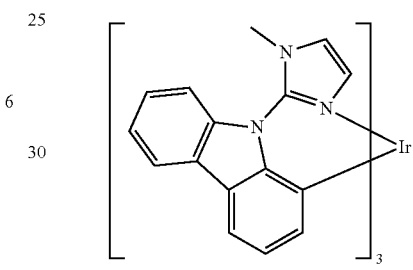
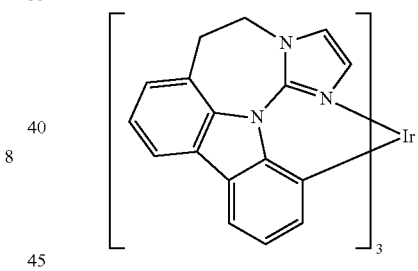
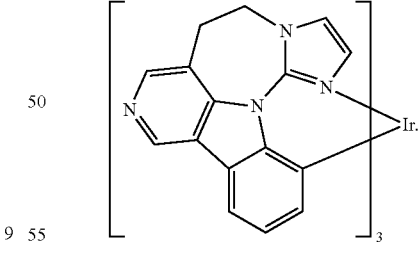
21. An organometallic compound represented by
Formula 1
$$Ir(L_1)_n(L_2)_{(3-n)}$$

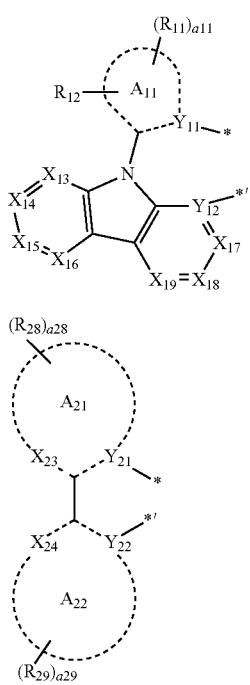

Formula 2

Formula 3 wherein in Formulae 1 to 3, $L_1$ is a first ligand represented by Formula 2;

$L_2$ is a second ligand represented by Formula 3, wherein $L_2$ includes at least one cyano group as a substituent;

n is selected from 2 and 3;

$A_{11}$ is selected from a $C_6$-$C_{60}$ cyclic group and a $C_1$-$C_{60}$ heterocyclic group, each comprising $Y_{11}$ as a cyclic ring member;

$A_{21}$, and $A_{22}$ are each independently selected from a naphthalene, an anthracene, a phenanthrene, a pyrrole, an imidazole, a pyrazole, a thiazole, an isothiazole, an oxazole, an isoxazole, a pyridine, a pyrazine, a pyrimidine, a pyridazine, a quinoline, an isoquinoline, a benzoquinoline, a quinoxaline, a quinazoline, a benzoimidazole, a benzoxazole, an isobenzoxazole, a triazole, a tetrazole, an oxadiazole, a triazine, a pyridoindole, a pyridofuran, and a pyridothiophene;

$Y_{11}$, $Y_{12}$, $Y_{21}$, and $Y_{22}$ are each independently selected from C and N;

$X_{13}$ is N or $CR_{13}$;
$X_{14}$ is N or $CR_{14}$;
$X_{15}$ is N or $CR_{15}$;
$X_{16}$ is N or $CR_{16}$;
$X_{17}$ is N or $CR_{17}$;
$X_{18}$ is N or $CR_{18}$;
$X_{19}$ is N or $CR_{19}$;
$X_{23}$ is N or $CR_{23}$; and
$X_{24}$ is N or $CR_{24}$;

wherein at least one selected from $X_{13}$ to $X_{19}$ is nitrogen;

provided that when $Y_{22}$ is C, then $X_{25}$ is N;

provided that when $X_{25}$ is C, then $Y_{22}$ is N;

$R_{11}$ to $R_{19}$, $R_{23}$, $R_{24}$, $R_{28}$, and $R_{29}$ are each independently selected from a hydrogen, a deuterium, —F, —Cl, —Br, —I, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_1$-$C_{60}$ heteroaryl group;

a11, a28, and a29 are each independently selected from 1, 2, 3, 4, 5, and 6;

$R_{12}$ and $R_{13}$ are optionally linked to each other via a divalent linking group selected from a single bond, *—O—*', *—S—*', *—N($Z_{11}$)—*', and *—[C($Z_{11}$)($Z_{12}$)]$_{b11}$—*'; wherein $Z_{11}$ and $Z_{12}$ are each independently selected from a hydrogen, a deuterium, —F, —Cl, —Br, —I, a substituted or unsubstituted $C_1$-$C_{60}$ alkyl group, and a substituted or unsubstituted $C_6$-$C_{60}$ aryl group;

b11 is selected from 1, 2, 3, and 4;

* and *' are each independently a binding site to a neighboring atom;

a11 is selected from 1, 2, and 3;

* and *' indicates a binding site to a neighboring atom;

at least one substituent of the substituted $C_1$-$C_{60}$ alkyl group, substituted $C_1$-$C_{60}$ alkoxy group, substituted $C_6$-$C_{60}$ aryl group, and substituted $C_1$-$C_{60}$ heteroaryl group is selected from a deuterium, —F, —Cl, —Br, —I, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from a deuterium, —F, —Cl, —Br, —I, a $C_1$-$C_{60}$ alkyl group, a $C_1$-$C_{60}$ alkoxy group, and —Si($Q_{11}$)($Q_{12}$)($Q_{13}$);

a $C_6$-$C_{60}$ aryl group, a $C_6$-$C_{60}$ aryloxy group, a $C_6$-$C_{60}$ arylthio group, and a $C_1$-$C_{60}$ heteroaryl group;

a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one selected from a deuterium, —F, —Cl, —Br, —I, a $C_1$-$C_{60}$ alkyl group, a $C_1$-$C_{60}$ alkoxy group, a $C_6$-$C_{60}$ aryl group, a $C_6$-$C_{60}$ aryloxy group, a $C_6$-$C_{60}$ arylthio group, a $C_1$-$C_{60}$ heteroaryl group, and —Si($Q_{21}$)($Q_{22}$)($Q_{23}$); and —Si($Q_{31}$)($Q_{32}$)($Q_{33}$);

wherein $Q_{11}$ to $Q_{13}$, $Q_{21}$ to $Q_{23}$, and $Q_{31}$ to $Q_{33}$ are each independently selected from a $C_1$-$C_{60}$ alkyl group and $C_6$-$C_{60}$ aryl group.

* * * * *